United States Patent
Ohnuma et al.

(10) Patent No.: US 8,236,630 B2
(45) Date of Patent: Aug. 7, 2012

(54) MANUFACTURING METHOD OF SEMICONDUCTOR DEVICE, SEMICONDUCTOR DEVICE, AND ELECTRONIC DEVICE

(75) Inventors: Hideto Ohnuma, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 514 days.

(21) Appl. No.: 12/230,331

(22) Filed: Aug. 27, 2008

(65) Prior Publication Data

US 2009/0057726 A1  Mar. 5, 2009

(30) Foreign Application Priority Data

Aug. 31, 2007  (JP) .................. 2007-227042

(51) Int. Cl.
*H01L 21/00* (2006.01)
*H01L 21/30* (2006.01)
(52) U.S. Cl. ........................ 438/150; 438/458
(58) Field of Classification Search .................. 438/150, 438/198, 311, 458; 257/255, E29.004
See application file for complete search history.

(56) References Cited

U.S. PATENT DOCUMENTS

| | | | |
|---|---|---|---|
| 5,374,564 A | 12/1994 | Bruel | |
| 6,037,610 A | 3/2000 | Zhang et al. | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,506,662 B2 * | 1/2003 | Ogura et al. | 438/423 |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,291,542 B2 | 11/2007 | Iwamatsu et al. | |
| 2002/0109144 A1 | 8/2002 | Yamazaki | |
| 2002/0137265 A1 * | 9/2002 | Yamazaki et al. | 438/150 |
| 2004/0061176 A1 | 4/2004 | Takafuji et al. | |
| 2004/0061200 A1 | 4/2004 | Iwamatsu et al. | |
| 2004/0104424 A1 | 6/2004 | Yamazaki | |

(Continued)

FOREIGN PATENT DOCUMENTS

JP  11-163363  6/1999

(Continued)

*Primary Examiner* — Hung Vu
(74) *Attorney, Agent, or Firm* — Eric J. Robinson; Robinson Intellectual Property Law Office, P.C.

(57) ABSTRACT

An embrittlement layer is formed in a single crystal semiconductor substrate having a (110) plane as a main surface by irradiation of the main surface with ions, and an insulating layer is formed over the main surface of the single crystal semiconductor substrate. The insulating layer and a substrate having an insulating surface are bonded, and the single crystal semiconductor substrate is separated along the embrittlement layer to provide a single crystal semiconductor layer having the (110) plane as a main surface over the substrate having the insulating surface. Then, an n-channel transistor and a p-channel transistor are formed so as to each have a <110> axis of the single crystal semiconductor layer in a channel length direction.

22 Claims, 18 Drawing Sheets

U.S. PATENT DOCUMENTS

| | | |
|---|---|---|
| 2005/0009252 A1 | 1/2005 | Yamazaki et al. |
| 2005/0260800 A1 | 11/2005 | Takano |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |

FOREIGN PATENT DOCUMENTS

| | | |
|---|---|---|
| JP | 2006-229047 | 8/2006 |

* cited by examiner (110) plane (100) plane

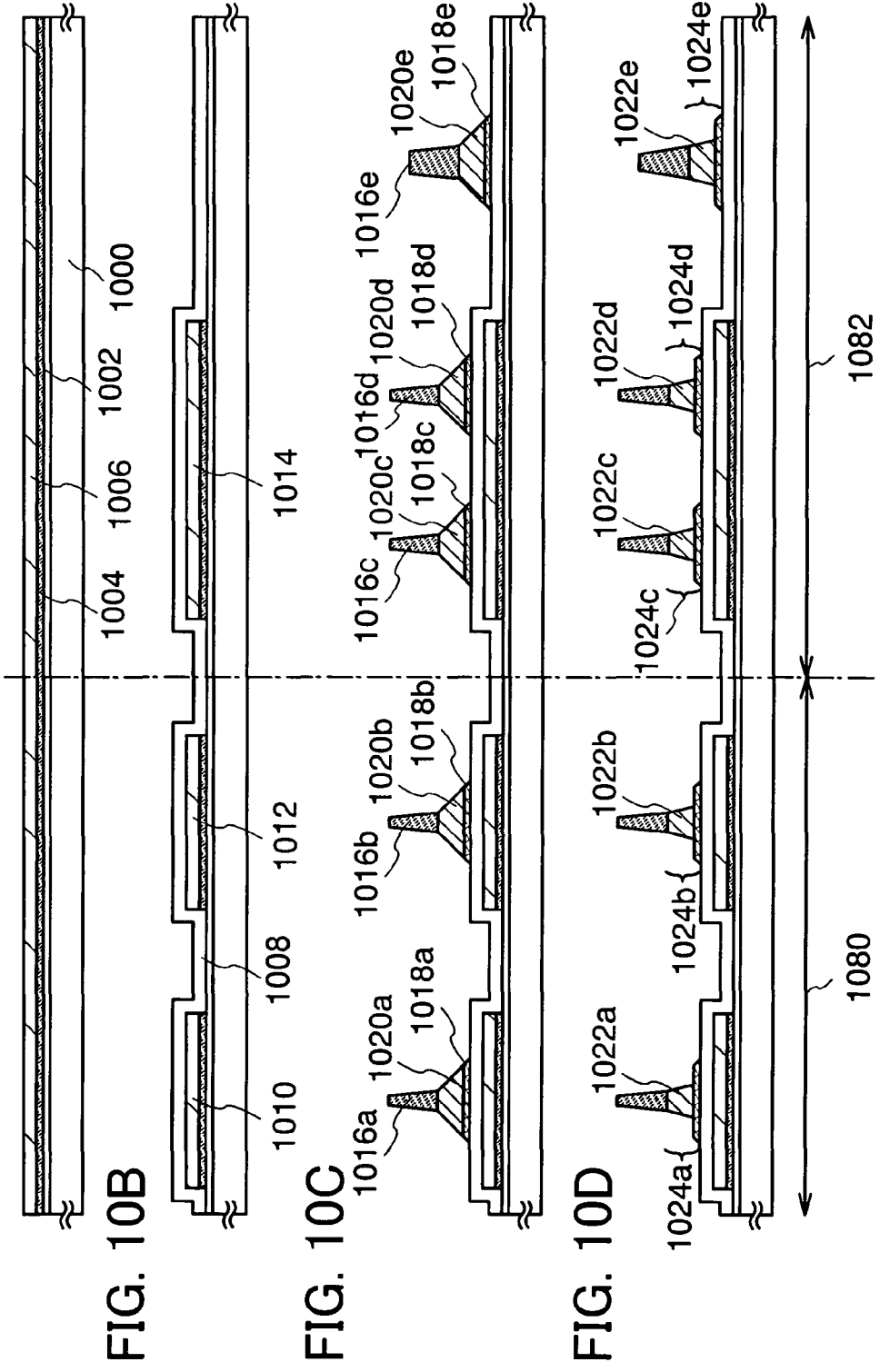

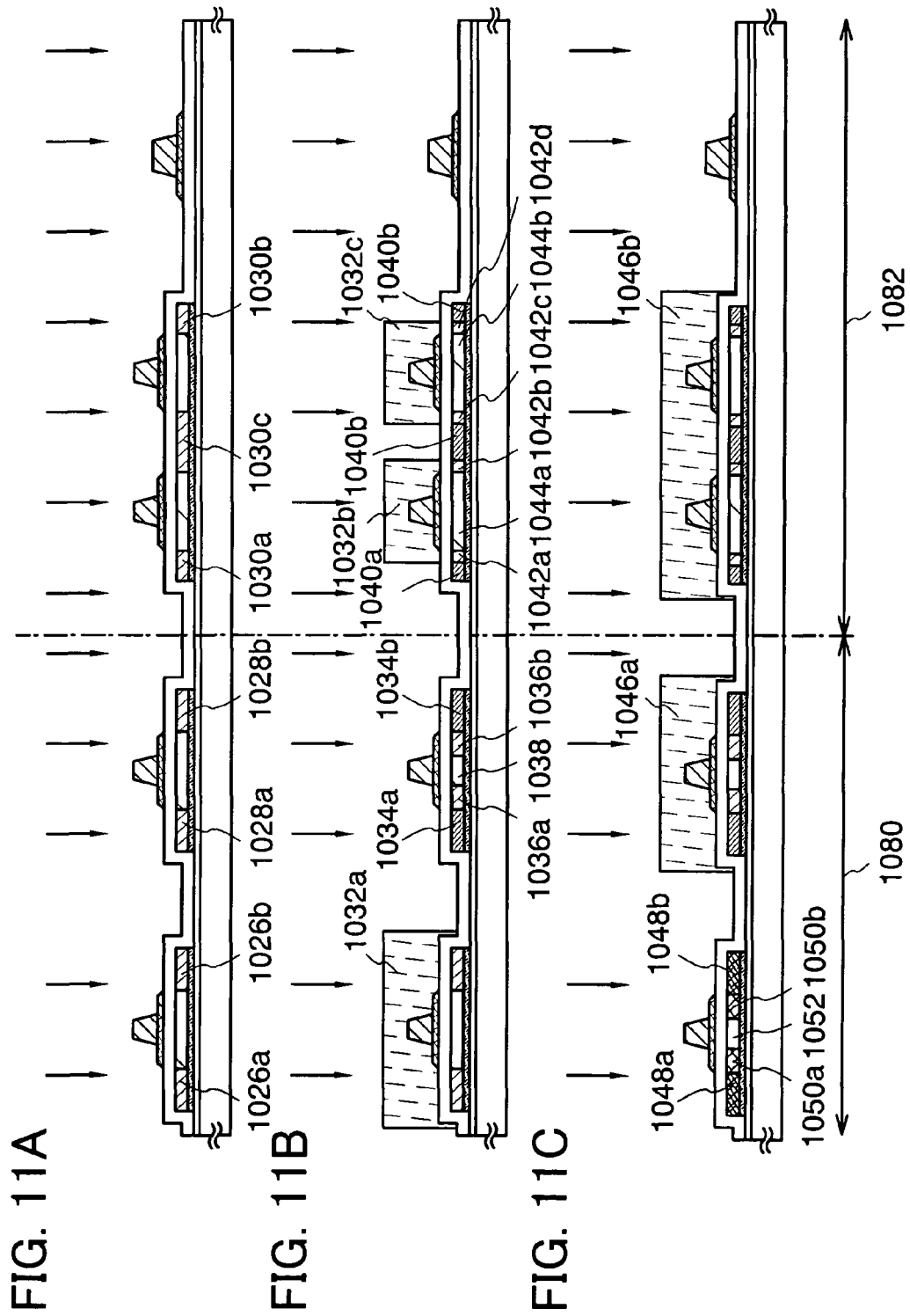

MANUFACTURING METHOD OF SEMICONDUCTOR DEVICE, SEMICONDUCTOR DEVICE, AND ELECTRONIC DEVICE

BACKGROUND OF THE INVENTION

1. Field of the Invention

The present invention relates to a manufacturing method of a semiconductor device, a semiconductor device, and an electronic device.

2. Description of the Related Art

In recent years, an integrated circuit that uses an SOI (silicon on insulator) substrate replacing a silicon wafer formed by thinly slicing an ingot of single crystal silicon, has been developed. An SOI substrate has a structure in which a thin single crystal silicon layer is provided on an insulating surface. By using this structure, parasitic capacitance between a drain of a transistor and a substrate can be reduced and performance of a semiconductor integrated circuit can be improved.

There are various manufacturing methods of an SOI substrate, and a technique called Smart Cut (registered trademark) is known as a method in which both quality and productivity (throughput) of a formed single crystal semiconductor layer are balanced. In Smart Cut, hydrogen ions are implanted into a single crystal silicon substrate (bond wafer) and then the single crystal silicon substrate is bonded to another substrate (base wafer) at room temperature. Bonding is performed by forming a strong bond by van der Waals force. After that, heat treatment is performed at a temperature of approximately 500° C., so that the single crystal silicon substrate is separated at a region where the hydrogen ions have been implanted, and a single crystal silicon layer is left over another substrate (base wafer).

As an example of a technique of forming a single crystal silicon thin film over a glass substrate by using such Smart Cut, a technique by the present applicants is known (e.g., Patent Document 1: Japanese Published Patent Application No. H11-163363).

In the Patent Document 1, by forming an insulating film over a glass substrate, contamination of a single crystal silicon layer is prevented, and a high-performance semiconductor device is successfully provided.

SUMMARY OF THE INVENTION

In manufacturing an SOI substrate like the one mentioned above, a single crystal silicon substrate having a (100) plane as a main surface is used in many cases. This is because the (100) plane has a lower interface state density than the other crystal planes and is suitable for manufacturing a field-effect transistor (hereinafter also referred to as a FET). In particular, in the case of manufacturing an n-channel transistor, the (100) plane is very advantageous in terms of mobility.

However, in manufacturing an SOI substrate, particularly, an SOI substrate formed by Smart Cut, a single crystal silicon substrate (bond wafer) and another substrate (base wafer) are bonded to each other under a temperature condition of about room temperature. Therefore, improvement of adhesiveness between the single crystal silicon substrate (bond wafer) and the other substrate (base wafer) has been demanded. This is because defective operation is caused in the manufactured transistor in the case where a single crystal silicon layer is separated from the base wafer.

Further, among transistors which use an SOI substrate having a (100) plane as a main surface, since the mobility of carriers (holes) of a p-channel transistor is lower than the mobility of carriers (electrons) of an n-channel transistor, the p-channel transistor has had a larger size than the n-channel transistor. This has caused a useless place in circuit layout in the case of using both an n-channel transistor and a p-channel transistor, compared to the case of forming a circuit with use of transistors having the same polarity.

In view of the above problems, it is an object of the present invention to manufacture a semiconductor device with a suppressed incidence of separation of the single crystal semiconductor layer. It is another object to provide a semiconductor device with a reduced incidence of defects in transistors. In addition, it is another object to provide a small-sized semiconductor device whose circuit layout is optimized. Further, it is still another object to provide a high-performance and highly-reliable electronic device which uses the semiconductor device.

In the present invention, an SOI substrate is manufactured using a single crystal semiconductor substrate having a (110) plane as a main surface. In addition, an n-channel transistor and a p-channel transistor are formed so that each of them has a <110> axis in a channel length direction on the (110) plane. Here, "the channel length direction" is a direction in which carriers flow in a transistor.

One feature of a manufacturing method of a semiconductor device according to the present invention includes the steps of: forming an embrittlement layer in a single crystal semiconductor substrate having a (110) plane as a main surface by irradiation of the main surface with ions; forming an insulating layer over the main surface of the single crystal semiconductor substrate; bonding the insulating layer and a substrate having an insulating surface; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

Another feature of a manufacturing method of a semiconductor device according to the present invention includes the steps of: forming an embrittlement layer in a single crystal semiconductor substrate having a (110) plane as a main surface by irradiation of the main surface with ions; forming an insulating layer over a substrate having an insulating surface; bonding the insulating layer and the single crystal semiconductor substrate; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

In the above-described structures, the insulating layer preferably includes a silicon oxide film formed by a chemical vapor deposition method using an organosilane gas.

Another feature of a manufacturing method of a semiconductor device according to the present invention includes the steps of: forming an embrittlement layer in a single crystal semiconductor substrate having a (110) plane as a main surface by irradiation of the main surface with ions; forming a first insulating layer over a substrate having an insulating surface; forming a second insulating layer over the main surface of the single crystal semiconductor substrate; bonding the first insulating layer and the second insulating layer; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

In the above-described structure, the first insulating layer or the second insulating layer preferably includes a silicon oxide film formed by a chemical vapor deposition method using an organosilane gas. In addition, the first insulating layer may include a silicon oxide film, and the second insulating layer may include any of a silicon oxide film, a silicon oxynitride film, and a silicon nitride oxide film. Further, the first insulating layer may have a stacked structure of a silicon nitride film and a silicon oxide film, and the second insulating layer may include a silicon oxide film.

Further, in the above-described structure, plasma treatment may be performed on the main surface of the single crystal semiconductor substrate.

Another feature of a manufacturing method of a semiconductor device according to the present invention includes the steps of: forming a first insulating layer over a main surface of a (110) plane of a single crystal semiconductor substrate; forming an embrittlement layer in the single crystal semiconductor substrate by irradiation of the first insulating layer with ions; forming a second insulating layer over a surface of the first insulating layer; bonding the second insulating layer and a substrate having an insulating surface; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

Still another feature of a manufacturing method of a semiconductor device according to the present invention includes the steps of: forming a first insulating layer over a main surface of a (110) plane of a single crystal semiconductor substrate; forming an embrittlement layer in the single crystal semiconductor substrate by irradiation of the first insulating layer with ions; forming a second insulating layer over a substrate having an insulating surface; bonding the second insulating layer and the first insulating layer; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

In the above-described structures, the second insulating layer preferably includes a silicon oxide film formed by a chemical vapor deposition method using an organosilane gas.

A still further feature of a manufacturing method of a semiconductor device according to the present invention includes the steps of: forming a first insulating layer over a main surface of a (110) plane of a single crystal semiconductor substrate; forming an embrittlement layer in the single crystal semiconductor substrate by irradiation of the first insulating layer with ions; forming a second insulating layer over a substrate having an insulating surface; forming a third insulating layer over a surface of the first insulating layer; bonding the second insulating layer and the third insulating layer; separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

In the above-described structure, the second insulating layer or the third insulating layer preferably includes a silicon oxide film formed by a chemical vapor deposition method using an organosilane gas. In addition, the second insulating layer may include a silicon oxide film, and the third insulating layer may include any of a silicon oxide film, a silicon oxynitride film, and a silicon nitride oxide film. Further, the second insulating layer may have a stacked structure of a silicon nitride film and a silicon oxide film, and the third insulating layer may include a silicon oxide film.

In the above-described structure, the first insulating layer preferably includes any of a silicon oxide film, a silicon nitride film, a silicon oxynitride film, and a silicon nitride oxide film. For example, the first insulating layer can have a structure in which silicon oxynitride and silicon nitride oxide are sequentially stacked from the single crystal semiconductor substrate side. In the above-described structure, the first insulating layer preferably includes a thermal oxide film formed in an atmosphere containing HCl. In addition, the ions preferably include any of $H^+$, $H_2^+$, and $H_3^+$.

The n-channel transistor and the p-channel transistor are preferably formed so as to satisfy the relation: $W_n/L_n:W_p/L_p=1:x$ $(0.8 \leqq x \leqq 2)$, where $L_n$ is a channel length of the n-channel transistor, $W_n$ is a channel width of the n-channel transistor, $L_p$ is a channel length of the p-channel transistor, and $W_p$ is a channel width of the p-channel transistor. Here, "the channel length" is a length (width) of a channel formation region in a direction parallel to the direction in which carriers flow. In addition, "the channel width" is a length (width) of a channel formation region in a direction perpendicular to the direction in which carriers flow.

One feature of the present invention is a semiconductor device which includes an n-channel transistor and a p-channel transistor and which includes an insulating layer over a substrate having an insulating surface and a single crystal semiconductor layer having a (110) plane as a main surface over the insulating layer, in which the channel length direction of the n-channel transistor and the channel length direction of the p-channel transistor are both in a <110> axis direction.

In the above-described structure, the insulating layer preferably includes a silicon oxide film formed by a chemical vapor deposition method using an organosilane gas.

Another feature of the present invention is a semiconductor device which includes an n-channel transistor and a p-channel transistor and which includes a first insulating layer over a substrate having an insulating surface, a second insulating layer over the first insulating layer; and a single crystal semiconductor layer having a (110) plane as a main surface over the second insulating layer, in which the channel length direction of the n-channel transistor and the channel length direction of the p-channel transistor are both in a <110> axis direction.

In the above-described structure, the first insulating layer or the second insulating layer preferably includes a silicon oxide film formed by a chemical vapor deposition method using an organosilane gas. In addition, the first insulating layer may include a silicon oxide film, and the second insulating layer may have a stacked structure of a silicon oxide film, a silicon nitride film, and a silicon oxide film. Further, the first insulating layer may have a stacked structure of a silicon nitride film and a silicon oxide film, and the second insulating layer may include a silicon oxide film. In addition, the second insulating layer preferably includes a thermal oxide film formed in an atmosphere containing HCl.

Note that a relation: $W_n/L_n:W_p/L_p=1:x(0.8\leq x\leq 2)$ is preferably satisfied, where $L_n$ is a channel length of the n-channel transistor, $W_n$ is a channel width of the n-channel transistor, $L_p$ is a channel length of the p-channel transistor, and $W_p$ is a channel width of the p-channel transistor.

An electronic device can be manufactured using any of the semiconductor devices described above.

Note that in the present invention, a semiconductor device refers to a display device such as a liquid crystal display device and an electroluminescent display device; a wireless tag which is referred to as an RFID (radio frequency identification) tag, an RF tag, an RF chip, a wireless processor, a wireless memory, an IC (integrated circuit) tag, an IC label, an electronic tag, or an electronic chip; a microprocessor such as a central processing unit (CPU); an integrated circuit; and any other semiconductor devices using a single crystal semiconductor layer which is formed by being separated from a single crystal semiconductor substrate.

According to the present invention, a semiconductor device with a suppressed incidence of separation of the single crystal semiconductor layer can be manufactured. A semiconductor device with a reduced incidence of defects in transistors can be provided. In addition, the circuit layout can be optimized so that the circuit area is reduced; accordingly, a small-sized semiconductor device can be provided. Further, a high-performance and highly-reliable electronic device can be provided using the semiconductor device.

BRIEF DESCRIPTION OF THE DRAWINGS

In the accompanying drawings:

FIGS. 10A to 10D illustrate a manufacturing process of a semiconductor device of the present invention;

FIGS. 11A to 11C illustrate a manufacturing process of a semiconductor device of the present invention;

DETAILED DESCRIPTION OF THE INVENTION

Figure 1A:
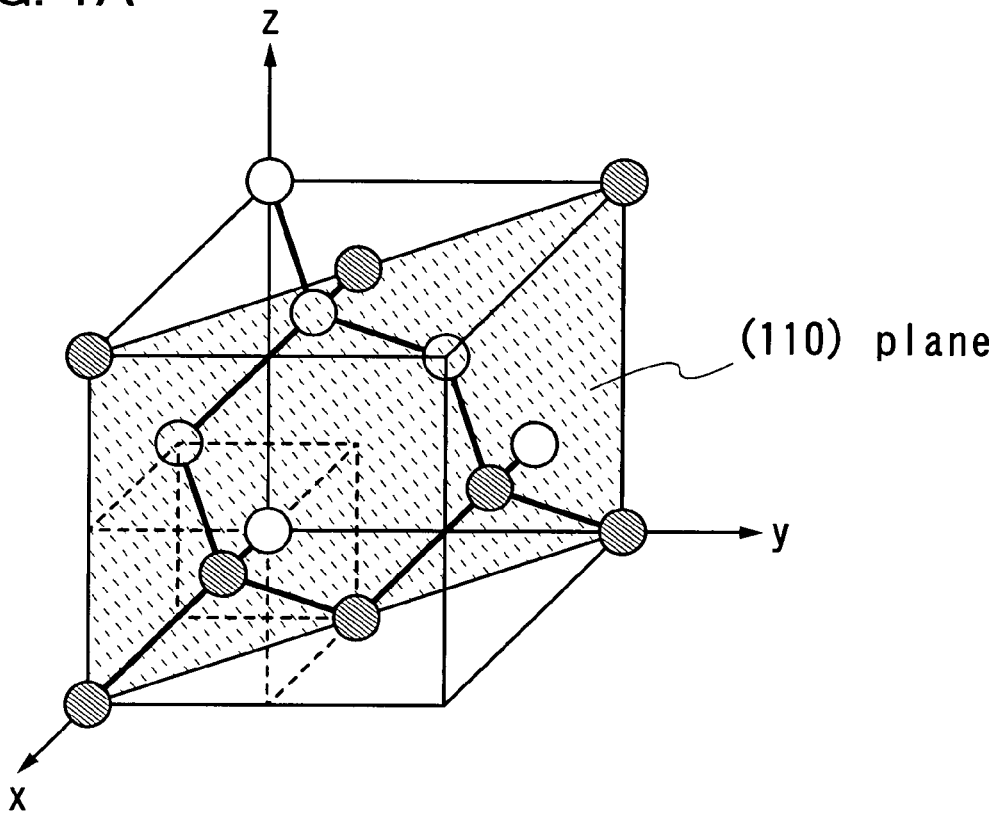
FIGS. 1A and 1B illustrate crystal lattice of a semiconductor.

Embodiment modes of the present invention will be described below with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having similar functions throughout the drawings.

Embodiment Mode 1

In Embodiment Mode 1, an example of a manufacturing method of a semiconductor substrate used in a semiconductor device of the present invention will be described with reference to FIGS. 1A and 1B, FIGS. 2A to 2D, and FIGS. 3A to 3C.

Figure 1B:
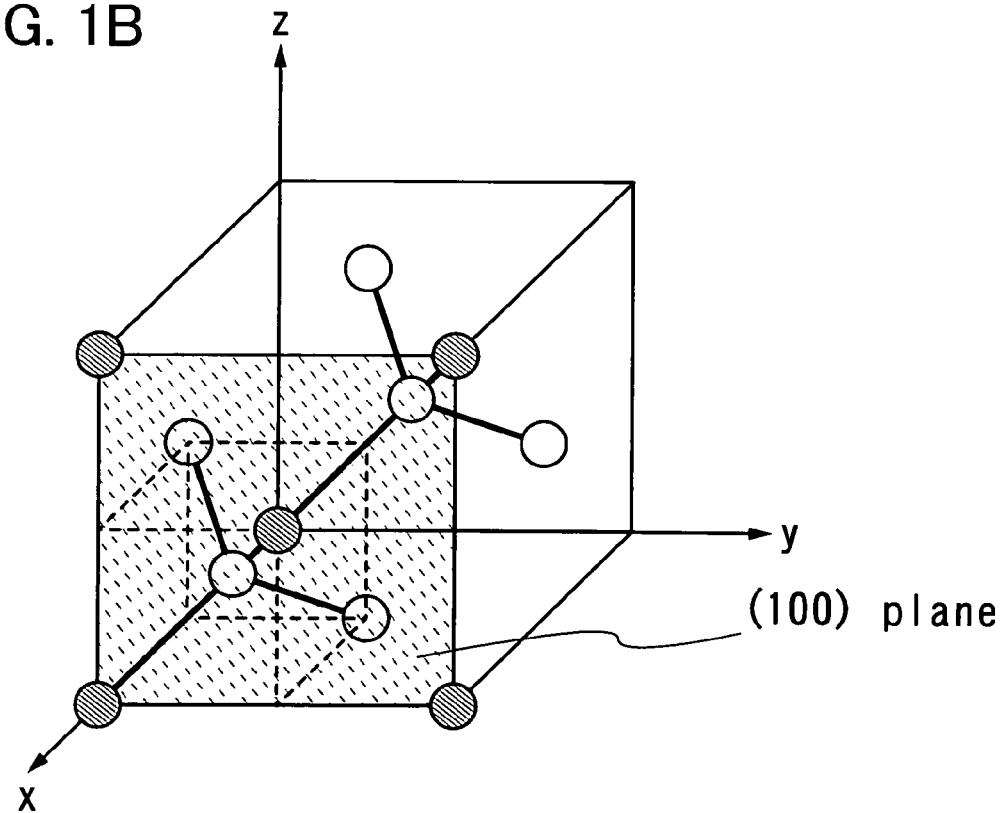

First, the crystal plane of a single crystal semiconductor is described briefly. FIGS. 1A and 1B illustrate the relations among a unit cell, a silicon element, and a crystal plane of single crystal silicon. Here, FIG. 1A illustrates a (110) plane and FIG. 1B illustrates a (100) plane, where part of the silicon atoms which are not involved in the crystal plane is omitted in each figure for simplification. Note that although silicon is taken as an example in FIGS. 1A and 1B, the present invention is not interpreted as being limited to this.

From FIGS. 1A and 1B, it is found that the surface density of silicon atoms on the (110) plane is higher than that of silicon atoms on the (100) plane in a unit cell of single crystal silicon. Therefore, when an SOI substrate is manufactured using a single crystal silicon substrate having the (110) plane as a main surface, an element forming an insulating layer and the silicon element are bonded tightly; therefore, adhesiveness between the insulating layer and the single crystal silicon layer is increased. Accordingly, separation of the single crystal silicon layer can be suppressed.

Since the atoms are densely arranged on the (110) plane as described above, usage of the (110) plane can improve flatness of a single crystal silicon layer in a manufactured SOI substrate as compared to the case of using other planes. That is, a transistor manufactured using such a single crystal silicon layer has superior characteristics. Note that the (110) plane has a higher Young's modulus than the (100) plane and has an advantage of easy separation.

Next, a manufacturing method of a semiconductor substrate is described with reference to FIGS. 2A to 2D and FIGS. 3A to 3C. Here, the case of providing an insulating layer which serves as a bonding layer on the single crystal semiconductor substrate side is described with reference to FIGS. 2A to 2D, and the case of providing an insulating layer which serves as a bonding layer on the side of a substrate having an insulating surface is described with reference to FIGS. 3A to 3C.

First, a single crystal semiconductor substrate 200 having a (110) plane as a main surface is prepared. Then, the single crystal semiconductor substrate 200 is irradiated with ions, so that the ions are introduced to a predetermined depth from the main surface; thus, an embrittlement layer 202 and a single crystal semiconductor layer 204 are formed (see FIG. 2A). As a method for forming the embrittlement layer 202, a method used for adding an impurity element to a semiconductor layer (hereinafter referred to as an ion doping method), a method for selectively implanting a mass-separated ionized gas into a semiconductor layer (hereinafter referred to as an ion implantation method), and the like can be given. The irradiation with the ions may be conducted in consideration of the thickness of the single crystal semiconductor layer 204 which is to be formed. The single crystal semiconductor layer 204 may have a thickness of approximately 5 nm to 500 nm, and preferably has a thickness of 10 to 200 nm. The acceleration voltage in irradiation with the ions can be determined in consideration of the above thickness.

The single crystal semiconductor substrate 200 is not particularly limited as long as it is a single crystal semiconductor substrate having a (110) plane as a main surface. Note that when the adhesiveness between the insulating layer and the single crystal semiconductor layer or the flatness of the single crystal semiconductor layer is desired to be increased, a single crystal semiconductor substrate having, as a main surface, a plane on which the number of atoms forming the crystal plane is large is preferably used. From this aspect, the term "the (110) plane" in this specification may be read as, for example, "a crystal plane on which the number of atoms is larger than that of atoms on other crystal planes (e.g., the (100) plane)."

As the ions used for irradiation, ions of a halogen typified by fluorine, hydrogen, helium, and the like are given. In the case of irradiation with fluorine ions as halogen ions, $BF_3$ may be used as a material gas. For example, in the case of using a single crystal silicon substrate as the single crystal semiconductor substrate 200 and introducing halogen ions such as fluorine ions into the single crystal silicon substrate, microvoids are formed in the embrittlement layer 202. This is because the halogen ions introduced into the single crystal silicon substrate purges silicon atoms in a silicon crystal lattice. By changing the volume of the thus formed microvoids, the single crystal silicon substrate can be separated (cleaved). Specifically, change in volume of the microvoids is induced by a low-temperature heat treatment. After the irradiation with the fluorine ions, irradiation with hydrogen ions may be performed so that the hydrogen ions are contained in the voids.

Alternatively, the single crystal silicon substrate may be irradiated with a plurality of ions which are made up of same atoms and have different masses. For example, in the case of irradiation with hydrogen ions, $H^+$, $H_2^+$, and $H_3^+$ are preferably included, and the proportion of the $H_3^+$ ions is preferably increased. Increase in the proportion of $H_3^+$ ions results in increase in irradiation efficiency; thus, irradiation time can be shortened. Note that usage of the (110) plane of the single crystal semiconductor substrate 200 makes it possible to obtain a flat separation surface because the number of atoms on the (110) plane is larger than those on the other crystal planes.

For example, irradiation with ions can be performed by an ion doping method that uses a hydrogen gas as a source material at an acceleration voltage of 40 kV and at approximately $2.2 \times 10^{16}$ ions/cm². The preferable acceleration voltage is approximately 30 kV to 80 kV, and in this case, irradiation with ions can be performed at $1.8 \times 10^{16}$ ions/cm² to $4.0 \times 10^{16}$ ions/cm².

When an embrittlement layer is formed along the (110) plane, the concentration distribution tends to be broad due to ion channeling. Therefore, it is preferable to irradiate a single crystal semiconductor substrate with ions, with the single crystal semiconductor substrate inclined at an angle of approximately 7°±5° to the horizontal. The single crystal semiconductor substrate is preferably inclined at an angle to the horizontal in ion irradiation, in order to make the variance of concentration distribution smaller.

In the case where defects at the interface (i.e., interface state) between the single crystal semiconductor layer 204 and an insulating layer to be formed later needs to be reduced, plasma treatment may be performed on a surface of the single crystal semiconductor layer 204 which is to be an interface, for example. Specifically, plasma treatment is performed under a hydrogen atmosphere, an oxygen atmosphere, or a mixed atmosphere of oxygen and hydrogen. By performing the plasma treatment under the hydrogen atmosphere, the surface is etched and contaminants can be removed. Furthermore, one part of the surface of the single crystal semiconductor layer 204 can be removed and an inner dense region can be exposed. In addition, dangling bonds in the single crystal semiconductor layer can be terminated by hydrogen. Moreover, by performing the plasma treatment under the oxygen atmosphere, a dense oxygen film can be formed on the surface. In other words, by performing the plasma treatment under these atmospheres, the interface between the single crystal semiconductor layer 204 and an insulating layer to be formed later can be kept clean and defects can be reduced. A similar advantageous effect can be obtained even if a rare gas element is added to the above atmospheres.

As a method for reducing the defects at the interface, there is a method of forming an oxide film by a thermal oxidation method. However, the high temperature condition needed for thermal oxidation can not be applied to a Smart Cut technique. In the Smart Cut technique, separation of a single crystal semiconductor layer is conducted by heat treatment; however, the temperature condition of the heat treatment is as comparatively low as about 400° C. to 600° C. inclusive. On the other hand, the temperature condition needed for the thermal oxidation is 800° C. or higher, and in the case where such a high temperature process is employed in the Smart Cut technique, separation of the single crystal semiconductor layer 204 is advanced. For the foregoing reasons, it is apparent that the plasma treatment is preferable to reduce defects at the interface in the Smart Cut technique.

The plasma treatment is preferably performed using a high frequency wave (such as a microwave) under the conditions of high density (preferably, in the range of $1 \times 10^{11}$ cm⁻³ to $1 \times 10^{13}$ cm⁻³ inclusive) and a low electron temperature (preferably, in the range of 0.2 eV to 2.0 eV inclusive, more preferably, in the range of 0.5 eV to 1.5 eV inclusive) (such plasma treatment is hereinafter referred to as "high-density plasma treatment"). The high-density plasma treatment that features a low electron temperature has low kinetic energy of active species; therefore, damage due to plasma is less than the case of normal plasma treatment. Therefore, a more favorable interface as compared to the one formed by the normal plasma treatment can be formed. The high-density plasma treatment is preferably performed in a mixed atmosphere of hydrogen and a rare gas (such as helium, neon, argon, krypton, or xenon) or a mixed atmosphere of oxygen, hydrogen, and a rare gas.

In this embodiment mode, an example of performing the plasma treatment in the atmosphere containing at least hydrogen or oxide is described; however, the present invention is not limited to this. For example, the plasma treatment may be performed in an atmosphere containing nitrogen oxide, ammonia, nitrogen, or the like, or in a mixed atmosphere of any of these gases and hydrogen, oxygen, a rare gas, or the like.

Figure 2A:
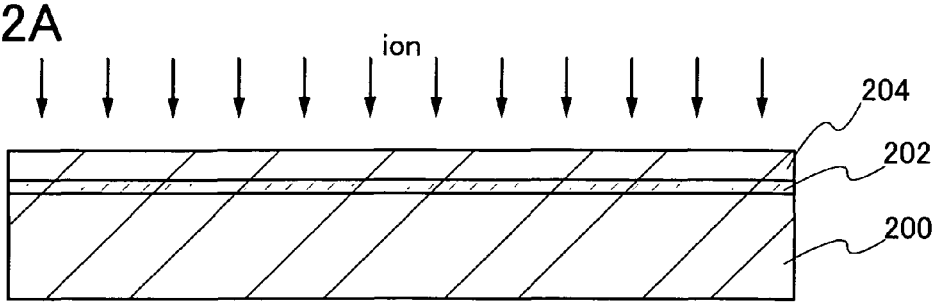
FIGS. 2A to 2D illustrate a manufacturing process of a semiconductor substrate according to the present invention.
Figure 2B:
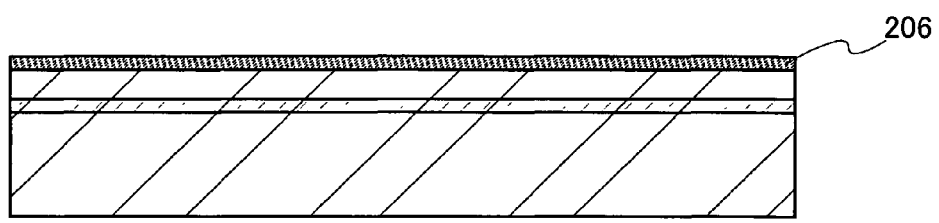

Next, an insulating layer 206 serving as a bonding layer is formed over the single crystal semiconductor layer 204 (see FIG. 2B). The insulating layer 206 is preferably formed of a silicon oxide film by a chemical vapor deposition method (CVD method) using an organosilane gas. Alternatively, a silicon oxide film formed by a chemical vapor deposition method using a silane gas can be applied. In the case where the chemical vapor deposition method is used, it is necessary to employ such a temperature condition as not to cause degasification of the embrittlement layer 202. The temperature of the heat treatment to separate the single crystal semiconductor layer 204 from the single crystal semiconductor substrate 200 is higher than the film-formation temperature.

As the organosilane gas, tetraethoxysilane (TEOS), trimethylsilane, tetramethylsilane, tetramethylcyclotetrasiloxane (TMCTS), octamethylcyclotetrasiloxane (OMCTS), hexamethyldisilazane (HMDS), triethoxysilane, or trisdimethylaminosilane, or the like can be used.

As the insulating layer 206, a silicon oxynitride film may be formed by an LPCVD method using monosilane and nitrogen dioxide as source gases. Accordingly, a preferable insulating layer 206 can be formed even under a low-temperature condition of 300° C. to 400° C. inclusive. For example, a preferable insulating layer can be formed under the condition where the flow rate of monosilane is 40 sccm, the flow rate of nitrogen dioxide is 400 sccm, the pressure is 266.6 Pa, and the temperature is 350° C.

The bonding layer 206 is formed with a thickness of about 5 nm to 500 nm. With such a thickness, a surface of the bonding layer 206 can be smoothed and the smoothness of the growth surface of the insulating layer 206 can be secured as well. In addition, distortion between a substrate and the single crystal semiconductor layer that are to be bonded to each other can be relieved. Note that the substrate having an insulating surface used in a subsequent step can also be provided with a similar insulating layer. When a silicon oxide film formed of organosilane as a material is provided over either or both of the surfaces that are to be bonded to each other in the above-described manner, a strong bond can be formed.

Note that a nitrogen-containing insulating layer may be provided between the single crystal semiconductor layer 204 and the insulating layer 206. The nitrogen-containing insulating layer can be formed of silicon nitride, silicon nitride oxide, silicon oxynitride, or the like. Note that the nitrogen-containing insulating layer may have either a single-layer structure or a stacked structure. For example, a silicon oxynitride film and a silicon nitride oxide film can be stacked from the single crystal semiconductor layer 204 side to obtain the nitrogen-containing insulating layer. The nitrogen-containing insulating layer is provided to prevent impurities such as movable ions like an alkali metal or an alkaline earth metal or moisture from entering the single crystal semiconductor layer 204. Note that an insulating layer other than the nitrogen-containing insulating layer may be provided as long as impurity entry can be prevented. In the case of providing the nitrogen-containing insulating layer, the insulating layer 206 and the nitrogen-containing insulating layer can be collectively called an insulating layer.

Note that a silicon oxynitride means the one that contains more oxygen than nitrogen and includes, for example, oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, a silicon nitride oxide means the one that contains more nitrogen than oxygen and includes, for example, oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The aforementioned ranges are ranges for cases measured using Rutherford backscattering spectrometry (RBS) and hydrogen forward scattering (HFS). Moreover, the total for the content ratio of the constituent elements is taken to be a value that does not exceed 100 at. %.

Figure 2C:
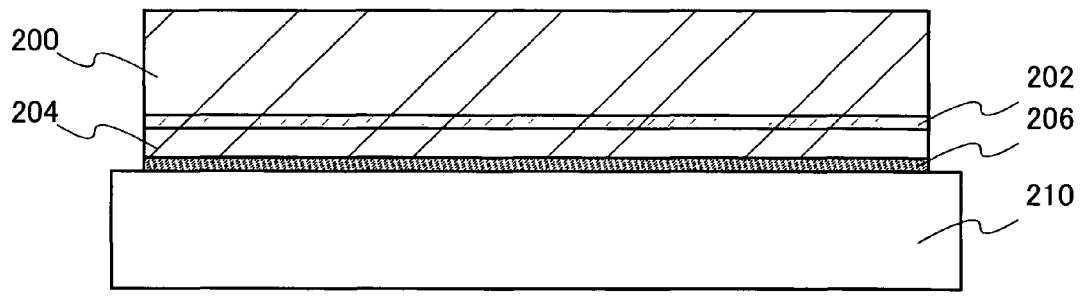

Next, a substrate 210 having an insulating surface and the bonding layer 206 are disposed in close contact with each other (see FIG. 2C). Pressure is applied to the substrate 210 having the insulating surface and the bonding layer 206, which are disposed in close contact with each other, whereby a strong bond can be formed. Note that it is preferable to perform heat treatment after the substrate 210 having the insulating surface and the single crystal semiconductor substrate 200 are bonded to each other with the bonding layer 206 interposed therebetween. The bonding strength can be further increased by performing heat treatment.

In order to form a favorable bond, the surfaces which are to be bonded to each other may be activated. For example, the surfaces which are to be bonded to each other are irradiated with an atomic beam or an ion beam. In the case of using an atomic beam or an ion beam, an inert gas atomic beam or inert gas ion beam of argon or the like can be used. Alternatively, plasma irradiation or radical treatment may be performed. Such surface treatment makes it possible to form a bond between different kinds of materials at a low temperature of approximately from 200° C. to 400° C.

As the substrate 210 having the insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. Among the substrates described above, a glass substrate is preferably used, and a mother glass substrate having a large area can also be used, such as a so-called sixth generation substrate (1500 mm×1850 mm), a so-called seventh generation substrate (1870 mm×2200 mm), and a so-called eighth generation substrate (2200 mm×2400 mm), for example. When a mother glass substrate having a large area is used as the substrate 210 having the insulating surface, the area of the semiconductor substrate can be enlarged. However, the substrate 210 having the insulating surface is not limited to the above mentioned substrates. For example, a substrate formed of a resin material can also be used if the allowable temperature limit permits. In the manufacturing method of this embodiment mode, a high-temperature process is not necessary, which allows the usage of a substrate having a low allowable temperature limit.

An insulating layer serving as a barrier layer may be provided over the substrate 210 having the insulating surface. When the insulating layer is provided, impurities such as an alkali metal or an alkaline earth metal can be prevented from entering the single crystal semiconductor layer 204. The insulating layer serving as a barrier layer is not necessarily provided when entry of the impurities from the substrate 210 having the insulating surface to the single crystal semiconductor layer 204 does not cause any problems.

The above-mentioned insulating layer can be formed using one or a plurality of materials selected from silicon oxide, silicon nitride, silicon nitride oxide, silicon oxynitride, or the like. The insulating layer may have either a single-layer structure or a stacked structure. As an example, silicon nitride and silicon oxide can be sequentially stacked from the side of the substrate 210 having the insulating surface, to form the insulating layer. The material for forming the insulating layer is not limited to the aforementioned materials if the entry of impurities can be prevented.

Figure 2D:
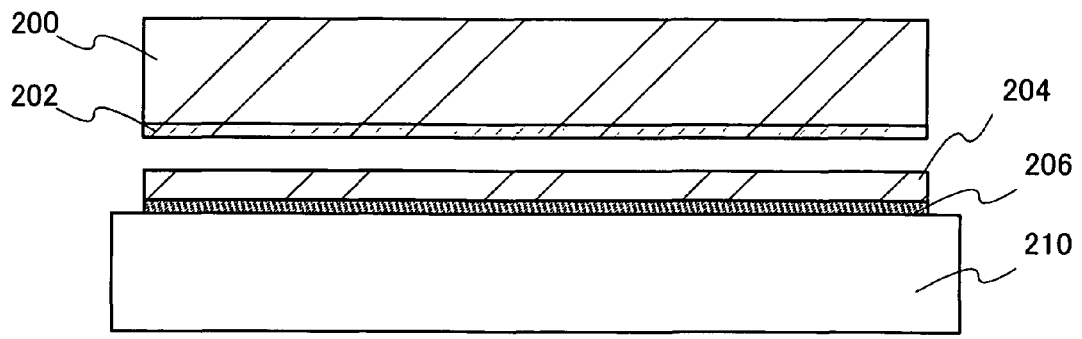

Next, heat treatment is performed so as to separate the single crystal semiconductor layer 204 from the single crystal semiconductor substrate 200 using the embrittlement layer 202 as a separation surface (see FIG. 2D). For example, by performing heat treatment at a temperature of 400° C. to 600° C., the pressure in microvoids formed in the embrittlement layer 202 is increased and the volume of the microvoids is increased, which can cause separation. Because the insulating layer 206 is bonded to the substrate 210 having the insulating surface, the single crystal semiconductor layer 204 having the same crystallinity as the single crystal semiconductor substrate 200 remains over the substrate 210 having the insulating surface.

Before the above-described heat treatment, heat treatment may be performed at a temperature approximately in a range of from 150° C. to 350° C. inclusive, so that the bonded interface can be strengthened. Accordingly, even when materials having different thermal expansion coefficients are bonded, separation from the bonded interface can be suppressed. For example, heat treatment at 200° C. for two hours may be employed.

When a glass substrate is used as the substrate 210 having the insulating surface, heat treatment may be performed approximately at a strain point of the glass substrate, specifically at a temperature of +50° C. of the strain point. More specifically, heat treatment may be performed at a temperature greater than or equal to 580° C. and less than or equal to 680° C. This heat treatment may be performed under an atmospheric pressure or a reduced pressure, and the atmosphere may be appropriately set and may be a nitrogen atmosphere, an oxygen atmosphere, or the like. Note that the heat treatment is applicable to the substrate other than the glass substrate in the case where the substrate has a characteristic of shrinking after being heated. More specifically, heat treatment may be performed at 200° C. for 2 hours and then heat treatment at 600° C. for two hours may be performed.

The glass substrate has a characteristic of shrinking when being heated. Therefore, when a glass substrate is preheated approximately at a strain point, specifically at a temperature of ±50° C. of the strain point (or higher) and then cooled, shrinkage in subsequent heat treatment can be suppressed. Thus, even when heat treatment is performed on the glass substrate to which a single crystal semiconductor layer having a different coefficient of thermal expansion is bonded, separation of the single crystal semiconductor layer from the glass substrate can be prevented. Further, transformation such as a warp of the glass substrate and the single crystal semiconductor layer can be prevented.

In the case of using the glass substrate, after heating the glass substrate, it is preferable to avoid rapid cooling. Specifically, the glass substrate is preferably cooled down to a temperature less than or equal to a strain point at a rate of less than or equal to 2° C./min, preferably more than or equal to 1° C./min and less than or equal to 2° C./min. With a low temperature falling rate, local stress which is generated by the shrinkage of the glass substrate can be eased.

Note that the heat treatment in the bonding step and the heat treatment in the separation step can be performed at the same time. In this case, two steps can be performed in one heat treatment; therefore, the semiconductor substrate can be manufactured at low cost.

Note that the single crystal semiconductor layer 204 obtained by the aforementioned steps is preferably subjected to chemical mechanical polishing (CMP) or the like in order to flatten the surface thereof. By improving flatness of the single crystal semiconductor layer 204, variation in characteristics of the semiconductor elements that are to be formed later can be suppressed. Note that as long as desired characteristics can be obtained, a CMP step or the like may be omitted.

Moreover, by performing another heat treatment or laser beam irradiation, characteristics of the single crystal semiconductor layer 204 may be improved. The temperature at heat treatment can be set at around an allowable temperature limit of the substrate 210 having the insulating surface. When a glass substrate is used as the substrate 210 having the insulating surface, the temperature at heat treatment may be set at around a strain point of the glass substrate. Specifically, the heat treatment may be performed at a temperature of approximately ±50° C. of the strain point (580° C. to 680° C., inclusive).

For laser beam irradiation, a continuous-wave laser (CW laser) or a pulsed laser (preferably having a repetition rate of 10 Hz or higher and 100 Hz or lower) can be used for example. Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium cadmium laser, or the like can be used. As the pulsed laser, an Ar laser, a Kr laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like can be used. Such a pulsed laser can be treated in the same manner as a CW laser, when the repetition rate is increased.

In particular, when laser beam irradiation is performed in an atmosphere containing oxygen at a low concentration of 10 ppm or lower to melt at least an upper part of the single crystal semiconductor layer, the surface of the single crystal semiconductor layer can be made flat. Further, the single crystal semiconductor layer is preferably subjected to CMP or etching before or after the laser beam irradiation in order to have a predetermined thickness. The above-mentioned treatment may be performed not only either before or after the laser beam irradiation but also both before and after the laser beam irradiation.

Figure 3A:
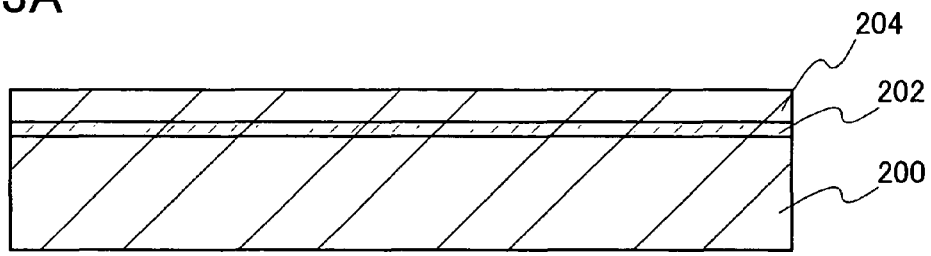
FIGS. 3A to 3C illustrate a manufacturing process of a semiconductor substrate according to the present invention.

Then, a case where the insulating layer 206 serving as a bonding layer is provided for the side of the substrate 210 having the insulating surface is described with reference to FIGS. 3A to 3C. Since the manufacturing process of the embrittlement layer 202 is similar to that in the case illustrated in FIGS. 2A to 2D, detailed description is omitted. In the case of employing plasma treatment, the aforementioned description thereof can be referred to.

Figure 3B:
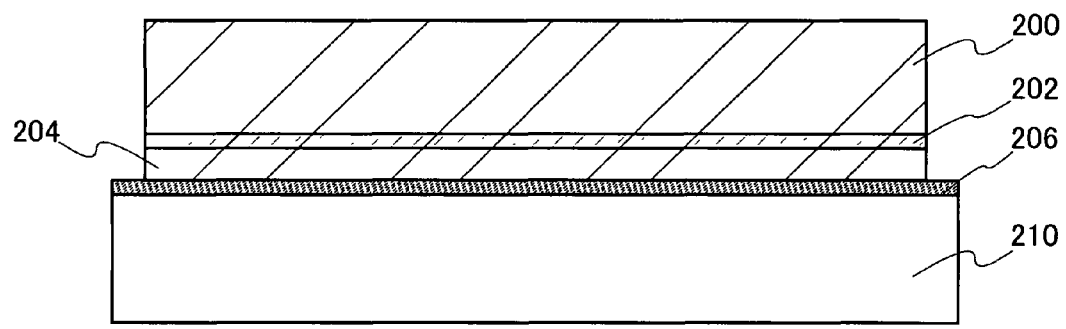

After forming the embrittlement layer 202 (see FIG. 3A), the insulating layer 206 which is formed on the substrate 210 having the insulating surface and serves as a bonding layer is made in close contact with the single crystal semiconductor layer 204 to be bonded to each other (see FIG. 3B). Alternatively, the insulating layer 206 may be formed after forming an insulating layer serving as a barrier layer on the substrate 210 having the insulating surface. When the insulating layer serving as a barrier layer is provided, impurities such as an alkali metal or an alkaline earth metal can be prevented from entering the single crystal semiconductor layer 204. The insulating layer serving as a barrier layer is not necessarily provided if entry of the impurities from the substrate 210 having the insulating surface to the single crystal semiconductor layer 204 does not cause any problems.

The aforementioned insulating layer serving as a barrier layer can be formed using one or a plurality of materials selected from silicon oxide, silicon nitride, silicon nitride oxide, silicon oxynitride, or the like. The insulating layer may have either a single-layer structure or a stacked structure. As an example, silicon nitride and silicon oxide can be sequentially stacked from the side of the substrate 210 having the insulating surface, to form the insulating layer. The material for forming the insulating layer is not limited to the aforementioned materials as long as the entry of impurities can be prevented.

Figure 3C:
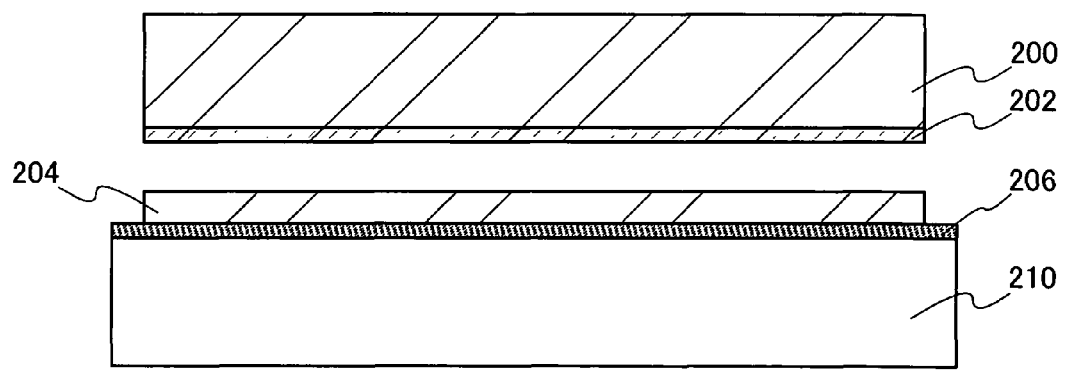

Then, the single crystal semiconductor substrate 200 is separated (see FIG. 3C). Since heat treatment at separation of the single crystal semiconductor substrate 200 can be performed in a manner similar to that of the case in FIG. 2D, detailed description is omitted. Accordingly, a semiconductor substrate illustrated in FIG. 3C can be obtained.

It is preferable that the semiconductor substrate illustrated in FIG. 3C be also subjected to chemical mechanical polishing (CMP) or the like. By improving flatness of the single crystal semiconductor layer 204, variation in characteristics of the semiconductor elements that are to be formed later can be suppressed. Note that as long as desired characteristics can be obtained, a CMP step or the like may be omitted.

Moreover, by performing another heat treatment or laser irradiation, characteristics of the single crystal semiconductor layer 204 may be improved. As for the heat treatment temperature and a laser capable of being used, the above description can be referred to; therefore, the description is omitted.

In the above-described manner, a semiconductor substrate which has a single crystal semiconductor layer having a (110) plane as a main surface can be provided. The surface density of atoms on the (110) plane is higher than that of silicon atoms on the other crystal planes. Therefore, adhesiveness between the insulating layer and the single crystal semiconductor layer is improved. Accordingly, separation of the single crystal semiconductor layer can be suppressed.

Since the atoms are densely arranged on the (110) plane as described above, usage of the (110) plane can improve flatness of the single crystal semiconductor layer in the manufactured SOI substrate as compared to the case of using other planes. That is, a transistor manufactured using such a single crystal semiconductor layer has superior characteristics.

Note that in the case where defects at the interface between the single crystal semiconductor layer and the insulating layer to be formed later needs to be reduced, plasma treatment may be performed on the surface of the single crystal semiconductor layer. Accordingly, a semiconductor substrate with extremely high quality can be provided.

Embodiment Mode 2

In Embodiment Mode 2, another example of a manufacturing method of a semiconductor device of the present invention will be described with reference to FIGS. 4A to 4E and FIGS. 5A to 5C. In this embodiment mode, a manufacturing method of a semiconductor substrate, which is capable of reducing damage to a single crystal semiconductor layer in ion irradiation, will be described. With reference to FIGS. 4A to 4E, the case where an insulating layer serving as a bonding layer is provided on the single crystal semiconductor substrate side will be described. With reference to FIGS. 5A to 5C, the case where an insulating layer serving as a bonding layer is provided on the side of a substrate having the insulating surface will be described.

First, a single crystal semiconductor substrate 400 having a (110) plane as a main surface is prepared. Then, an insulating layer 450 serving as a protective layer is formed over the single crystal semiconductor substrate 400 (see FIG. 4A). The description of Embodiment Mode 1 can be referred to for details of the single crystal semiconductor substrate; therefore, the description thereof is omitted here.

The insulating layer 450 can be formed of one or a plurality of materials selected from silicon oxide, silicon nitride, silicon nitride oxide, silicon oxynitride, or the like. The insulating layer 450 may have a single-layer structure or a stacked structure. As the method for forming the insulating layer 450, a chemical vapor deposition (CVD) method, a sputtering method, a thermal oxidation method, a thermal nitridation method, or the like is given. However, the method is not limited to these. In the case of using a thermal oxidation method for example, a thermal oxide film formed in an atmosphere which contains HCl at approximately 1 vol. % or more and 10 vol. % or less is preferably used as the insulating layer 450. It is preferable that the thickness of the insulating layer 450 be approximately 10 nm to 200 nm. By providing the insulating layer 450, it is possible to suppress roughness of the surface of the single crystal semiconductor substrate 400 (the surface of the single crystal semiconductor layer to be formed later) caused by ion irradiation.

Figure 4A:
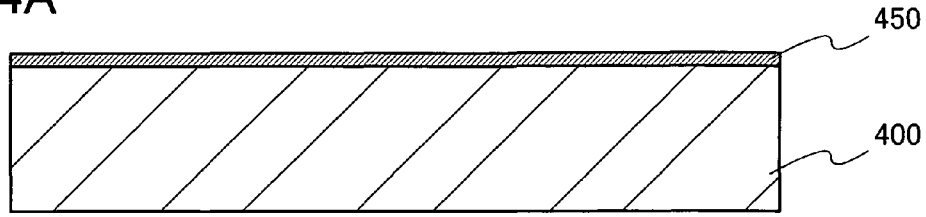
FIGS. 4A to 4E illustrate a manufacturing process of a semiconductor substrate according to the present invention.
Figure 4B:
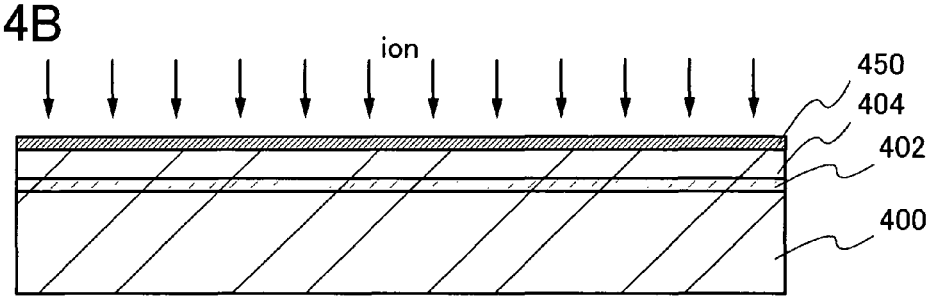
Figure 5A:
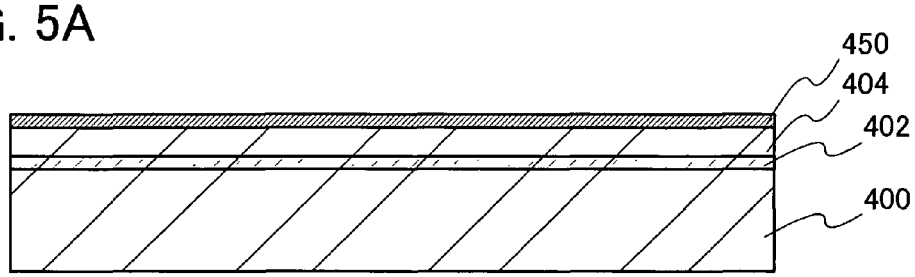
FIGS. 5A to 5C illustrate a manufacturing process of a semiconductor substrate according to the present invention.
Figure 5B:
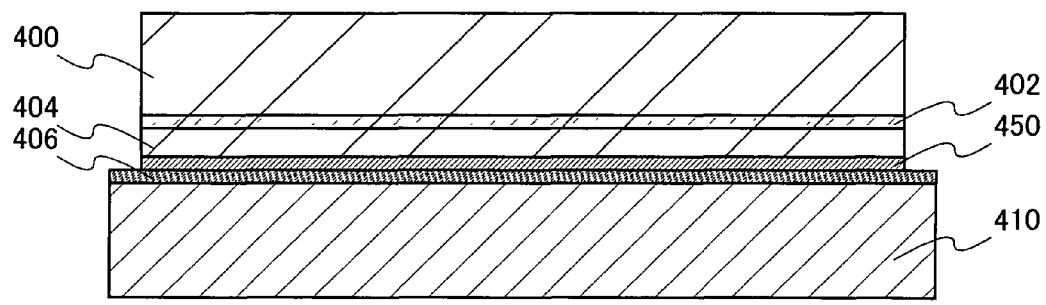
Figure 5C:
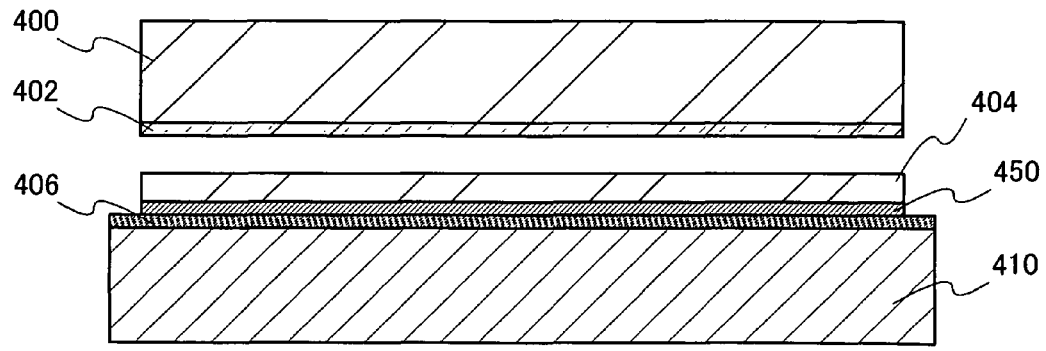

Then, ions are introduced to a predetermined depth from the surface of the single crystal semiconductor substrate 400 through the insulating layer 450, thereby forming an embrittlement layer 402 and a single crystal semiconductor layer 404 (see FIG. 4B). Embodiment Mode 1 can be referred to for details of the method for manufacturing the embrittlement layer 402 and the single crystal semiconductor layer 404; therefore, the description thereof is omitted here. After formation of the embrittlement layer 402, the insulating layer 450 may be removed. When the insulating layer 450 is left, the insulating layer 450 can be used as a base insulating layer. Therefore, the insulating layer 450 is preferably not removed. With the insulating layer 450, impurities such as movable ions of an alkali metal or an alkaline earth metal or moisture can be prevented from entering the single crystal semiconductor layer 404. In particular, when silicon nitride oxide or silicon nitride is used for the insulating layer 450, entry of the impurities into the single crystal semiconductor layer can be effectively prevented. For example, a silicon oxynitride film with a thickness of 50 nm and a silicon nitride oxide film with a thickness of 50 nm can be stacked in this order from the single crystal semiconductor substrate side. In this case, ion irradiation may be performed at an acceleration voltage of 40 kV at approximately $2.2 \times 10^{16}$ ions/cm$^2$. Alternatively, a silicon oxynitride film and a silicon nitride oxide film each having a thickness of 50 nm may be formed from the single crystal semiconductor substrate side by a PECVD method, and irradiation with H$^+$ ions, H$_2^+$ ions, and H$_3^+$ ions may be performed by a high-frequency discharge ion doping method at an acceleration voltage of approximately 35 kV and an ion dose of approximately $2.9 \times 10^{16}$ ions/cm$^2$. In this case, the thickness of the single crystal semiconductor layer after being separated is approximately 120 nm.

As a manufacturing method of the insulating layer 450, for example, a method of forming an oxide film on the surface of the single crystal semiconductor substrate 400 by using ozone water or hydrogen peroxide, or the like can be given as well as the above-described way. Alternatively, an oxide film may be formed on the surface of the single crystal semiconductor substrate 400 by exposure to an ozone atmosphere. Note that the ozone atmosphere can be created by irradiating an oxygen atmosphere with ultraviolet light. Further alternatively, an oxide film can be formed by performing plasma treatment in an atmosphere of $N_2O$ and $O_2$, plasma treatment in an atmosphere of $N_2$ and $O_2$, plasma treatment in an atmosphere of $N_2O$ and $NH_3$, plasma treatment in an $O_2$ atmosphere, or plasma treatment in an atmosphere of $N_2$, $O_2$, and $H_2$. In this case, the thickness of the oxide film is approximately 0.5 nm to 3 nm. After the formation of the embrittlement layer, silicon oxynitride, silicon nitride oxide, or the like can be stacked.

Figure 4C:
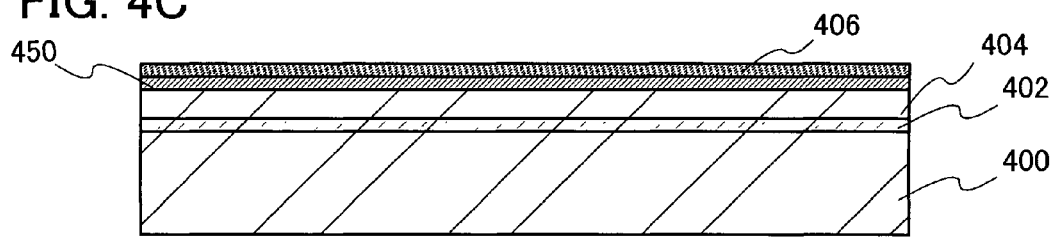

Next, an insulating layer 406 serving as a bonding layer is formed over the insulating layer 450 (see FIG. 4C). The insulating layer 406 is preferably formed of a silicon oxide film by a chemical vapor deposition method (CVD method) using an organosilane gas. Alternatively, a silicon oxide film formed by a chemical vapor deposition method using a silane gas can be applied. In the case where the chemical vapor deposition method is used, it is necessary to employ such a temperature condition as not to cause degasification of the embrittlement layer 402. The temperature of the heat treatment to separate the single crystal semiconductor layer 404 from the single crystal semiconductor substrate 400 is higher than the film-formation temperature.

Embodiment Mode 1 can be referred to for details of the manufacturing method of the insulating layer 406; therefore, the description thereof is omitted.

Figure 4D:
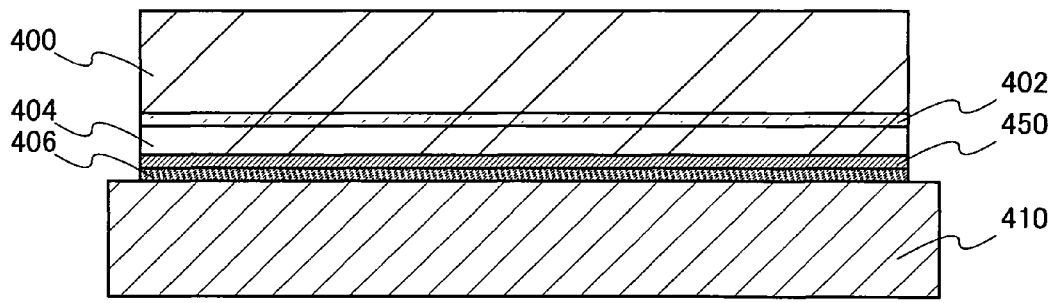

Next, a substrate 410 having an insulating surface and the insulating layer 406 are disposed in close contact with each other (see FIG. 4D). Pressure is applied to the substrate 410 having the insulating surface and the insulating layer 406, which are disposed in close contact with each other, whereby a strong bond can be formed. Note that it is preferable to perform heat treatment after the substrate 410 having the insulating surface and the single crystal semiconductor substrate 400 are bonded to each other with the insulating layer 406 interposed therebetween. The bonding strength can be further increased by performing heat treatment.

In order to form a favorable bond, the surfaces which are to be bonded to each other may be activated. For example, the surfaces which are to be bonded to each other are irradiated with an atomic beam or an ion beam. In the case of using an atomic beam or an ion beam, an inert gas atomic beam or inert gas ion beam of argon or the like can be used. Alternatively, plasma irradiation or radical treatment may be performed. Such surface treatment makes it possible to form a bond between different kinds of materials at a low temperature of approximately from 200° C. to 400° C.

As the substrate 410 having the insulating surface, any of a variety of glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can also be used, such as a so-called sixth generation substrate (1500 mm×1850 mm), a so-called seventh generation substrate (1870 mm×2200 mm), and a so-called eighth generation substrate (2200 mm×2400 mm), for example. When a mother glass substrate having a large area is used as the substrate 410 having the insulating surface, the area of the semiconductor substrate can be enlarged. However, the substrate 410 having the insulating surface is not limited to the above mentioned substrates. For example, a substrate formed of a resin material can also be used if the allowable temperature limit permits. In the manufacturing method of this embodiment mode, a high-temperature process is not necessary, which allows the usage of a substrate having a low allowable temperature limit.

Figure 4E:
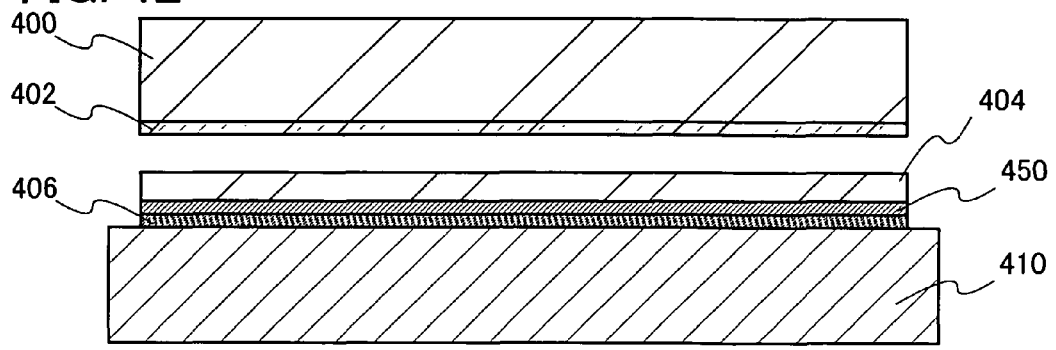

Next, heat treatment is performed so as to separate the single crystal semiconductor layer 404 from the single crystal semiconductor substrate 400 using the embrittlement layer 402 as a separation surface (see FIG. 4E). For example, by performing the heat treatment at a temperature of 400° C. to 600° C., the volume of microvoids formed in the embrittlement layer 402 is increased, which can cause separation. Because the insulating layer 406 is bonded to the substrate 410 having the insulating surface, the single crystal semiconductor layer 404 having the same crystallinity as the single crystal semiconductor substrate 400 remains over the substrate 410 having the insulating surface.

Embodiment Mode 1 can be referred to for details of the heat treatment for separation. Note that the heat treatment in the bonding step and the heat treatment in the separation step can be performed at the same time. In this case, two steps can be performed in one heat treatment; therefore, the semiconductor substrate can be manufactured at low cost.

Note that the single crystal semiconductor layer 404 obtained by the aforementioned steps is preferably subjected to chemical mechanical polishing (CMP) or the like in order to flatten the surface thereof. By improving flatness of the single crystal semiconductor layer 404, variation in characteristics of the semiconductor elements that are to be formed later can be suppressed. Note that as long as desired characteristics can be obtained, a CMP step or the like may be omitted.

Moreover, by performing another heat treatment or laser irradiation, characteristics of the single crystal semiconductor layer 404 may be improved. As for the heat treatment temperature and a laser capable of being used, the description in Embodiment Mode 1 can be referred to.

Next, the case where the insulating layer 406 serving as a bonding layer is provided on the side of the substrate 410 having the insulating surface is described with reference to FIGS. 5A to 5C. Since the process up to the formation of the embrittlement layer 402 is similar to the case illustrated in FIGS. 4A to 4E, detailed description is omitted.

After forming the embrittlement layer 402 (see FIG. 5A), the insulating layer 406 which is formed on the substrate 410 having the insulating surface and serves as a bonding layer is made in close contact with the insulating layer 450 to be bonded to each other (see FIG. 5B). Alternatively, the insulating layer 406 may be formed after forming an insulating layer serving as a barrier layer on the substrate 410 having the insulating surface. When the insulating layer serving as a barrier layer is provided, impurities such as an alkali metal or an alkaline earth metal can be prevented from entering the single crystal semiconductor layer 404. The insulating layer serving as a barrier layer is not necessarily provided if entry of the impurities from the substrate 410 having the insulating surface to the single crystal semiconductor layer 404 does not cause any problems.

The above-mentioned insulating layer serving as a barrier layer can be formed using one or a plurality of materials selected from silicon oxide, silicon nitride, silicon nitride oxide, silicon oxynitride, or the like. The insulating layer may have either a single-layer structure or a stacked structure. As an example, silicon nitride and silicon oxide can be sequentially stacked from the side of the substrate 410 having the insulating surface, to form the insulating layer. The material for forming the insulating layer is not limited to the aforementioned materials if the entry of impurities can be prevented.

Then, the single crystal semiconductor substrate 400 is separated (see FIG. 5C). Since Embodiment Mode 1 can be referred to for the heat treatment performed at separation of the single crystal semiconductor substrate 400, detailed description is omitted. Accordingly, a semiconductor substrate illustrated in FIG. 5C can be obtained.

It is preferable that the semiconductor substrate illustrated in FIG. 5C be also subjected to chemical mechanical polishing (CMP) or the like. By improving flatness of the single crystal semiconductor layer 404, variation in characteristics of the semiconductor elements that are to be formed later can be suppressed. Note that as long as desired characteristics can be obtained, a CMP step or the like may be omitted.

Moreover, by performing another heat treatment or laser irradiation, characteristics of the single crystal semiconductor layer 404 may be improved. As for the heat treatment temperature and a laser capable of being used, the description in Embodiment Mode 1 can be referred to; therefore, the description is omitted here.

In the above-described manner, a semiconductor substrate which has a single crystal semiconductor layer having a (110) plane as a main surface can be provided. The surface density of atoms on the (110) plane is higher than that of silicon atoms on the other crystal planes. Therefore, adhesiveness between the insulating layer and the single crystal semiconductor layer is improved. Accordingly, separation of the single crystal semiconductor layer can be suppressed.

Since the atoms are densely arranged on the (110) plane as described above, usage of the (110) plane can improve flatness of the single crystal semiconductor layer in the manufactured SOI substrate as compared to the case of using other planes. That is, a transistor manufactured using such a single crystal semiconductor layer has superior characteristics.

In this embodiment mode, by providing the insulating layer 450, damage to the single crystal semiconductor layer 404 due to ion irradiation is reduced. As a result, the number of defects can be reduced and characteristics of the semiconductor element can be further improved.

This embodiment mode can be implemented in combination with Embodiment Mode 1 as appropriate.

Embodiment Mode 3

In Embodiment Mode 3, an example of a manufacturing method of a semiconductor device which uses the semiconductor substrate manufactured in Embodiment Mode 1 or 2 will be described with reference to FIGS. 6A and 6B, FIGS. 7A to 7D, FIGS. 8A to 8C, and FIGS. 9A to 9C. In this embodiment mode, as a semiconductor device which uses an n-channel transistor and a p-channel transistor, a complementary semiconductor device (a so-called CMOS) will be described.

Figure 6A:
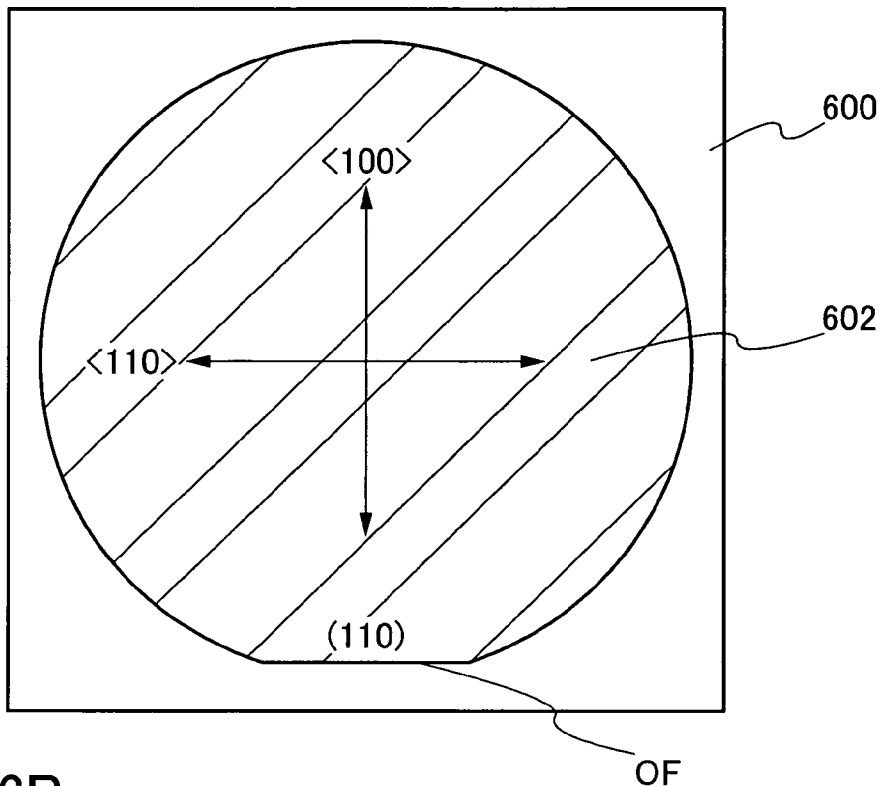
FIGS. 6A and 6B each illustrate a manufacturing step of a semiconductor device of the present invention.
Figure 6B:
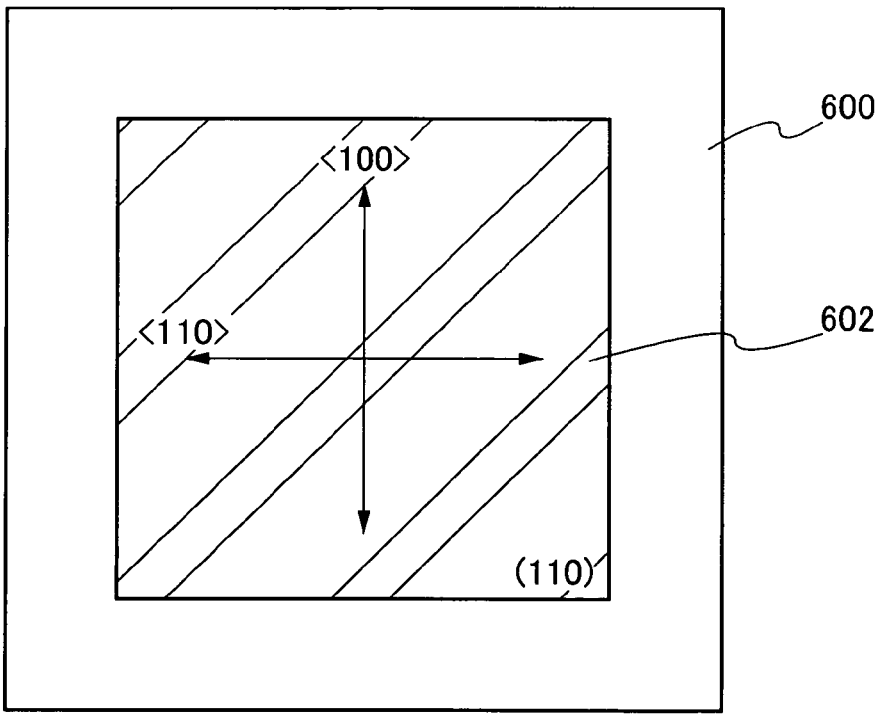

FIGS. 6A and 6B are each a plan view of a semiconductor substrate manufactured in Embodiment Mode 1. A single crystal semiconductor layer 602 having a (110) plane as a main surface is provided over a substrate 600 having an insulating surface. Here, FIG. 6A illustrates the case of forming the single crystal semiconductor layer 602 using a circular single crystal semiconductor substrate, and FIG. 6B illustrates the case of forming the single crystal semiconductor layer 602 using a rectangular single crystal semiconductor substrate. The case of using a circular single crystal semiconductor substrate as illustrated in FIG. 6A is preferable since it is not necessary to process the single crystal semiconductor substrate. The case of using a rectangular single crystal semiconductor substrate as illustrated in FIG. 6B is advantageous in that a plurality of single crystal semiconductor layers can be arranged in matrix and accordingly a large-area substrate can be obtained. Note that in FIG. 6A, the circular single crystal semiconductor layer 602 has such a shape in which one part is chipped, and the flat part of the single crystal semiconductor layer 602 is an orientation flat (OF). In FIG. 6B, an orientation flat is disposed in a direction parallel to a <110> axis.

Generally speaking, p-channel transistors have lower mobility than n-channel transistors. Therefore, in order that the n-channel transistors and the p-channel transistors have equivalent current drive capability (or high-speed operation), the channel width of the p-channel transistors needs to be relatively large. Here, when the n-channel transistors and the p-channel transistors are both used, the size of the p-channel transistors is an obstacle to optimizing the layout. In order to reduce the circuit area in optimizing the layout, it is required that the n-channel transistors and the p-channel transistors have the same or almost the same size.

In the present invention, the single crystal semiconductor layer 602 having a (110) plane as a main surface is used, and the channel length direction of transistors is disposed in a <110> axis direction, so that the p-channel transistor can have maximum mobility. Here, "the channel length direction" is a direction in which carriers flow in a transistor. Although the mobility of the n-channel transistor is sacrificed in some degree, arranging the channel length direction of transistors in the <110> axis direction is rather preferable from the standpoint of layout optimization. This is because the size of the n-channel transistor can be made closer to that of the p-channel transistor.

For example, when the channel length direction of the n-channel transistor is disposed in a <100> axis direction, higher mobility can be obtained as compared to the case where the channel length direction of the n-channel transistor is disposed in the <110> axis direction. However, in this case, the n-channel transistor and the p-channel transistor are perpendicular to each other, which is a heavy disadvantage in layout. When the channel length direction of the n-channel transistor and the p-channel transistor is disposed in the <110> axis direction, such a problem can be solved and the layout can be optimized.

Note that the mobility of the p-channel transistor can be maximum when the single crystal semiconductor layer having a (110) plane as a main surface is used and the channel length direction is disposed in the <110> axis direction (hereinafter, such a condition is referred to as "(110) plane-<110> axis", and the other conditions can be expressed similarly), and obtainable mobility decreases in the following order: (110) plane-<100> axis, (100) plane-<110> axis, and (100) plane-<100> axis. In contrast, the mobility of the n-channel transistor shows the opposite tendency to the p-channel transistor, and obtainable mobility decreases in the following order: (100) plane-<100> axis, (100) plane-<110> axis, (110) plane-<100> axis, and (110) plane-<110> axis.

Therefore, by using the condition of (110) plane-<110> axis, the p-channel transistor can have maximum mobility and the layout of the semiconductor device can be optimized; accordingly, miniaturization of the semiconductor device can be realized.

Next, an actual manufacturing method will be described with reference to FIGS. 7A to 7D, FIGS. 8A to 8C, and FIGS. 9A to 9C.

Figure 7A:
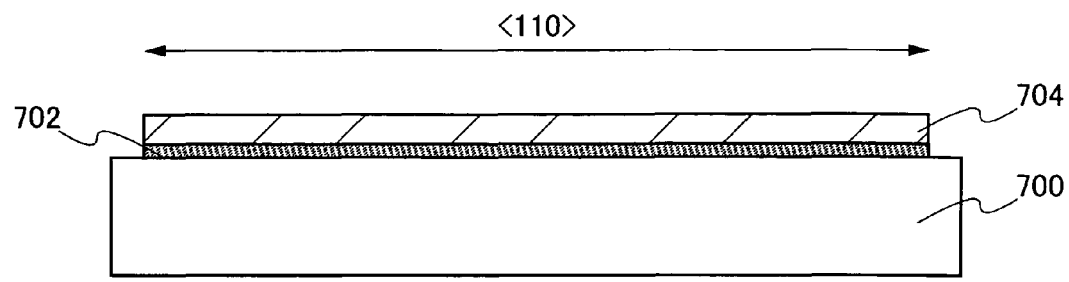
FIGS. 7A to 7D illustrate a manufacturing process of a semiconductor device of the present invention.

First, a single crystal semiconductor layer having a (110) plane as a main surface is formed over a substrate having an insulating surface by the method described in Embodiment Mode 1 or the like (see FIG. 7A). Although the structure where an insulating layer 702 serving as a bonding layer, and a single crystal semiconductor layer 704 are provided in this order over a substrate 700 having an insulating surface is described here, the present invention is not limited to this. The cross sections illustrated in FIGS. 7A to 7D are taken along the <110> axis of the single crystal semiconductor layer 704.

Then, the single crystal semiconductor layer 704 and the insulating layer 702 are patterned into a desired shape to form island-shaped semiconductor layers. At this time, the island-shaped semiconductor layers are formed so that the channel length direction of transistors to be formed later is the <110> axis direction.

As to an etching process in the patterning, either plasma etching (dry etching) or wet etching may be employed. In the case of processing a large-sized substrate, plasma etching is suitable. As an etching gas, a fluorine-based gas or a chlorine-based gas such as $CF_4$, $NF_3$, $Cl_2$, $BCl_3$, or the like is used. An inert gas such as He or Ar may be added to the etching gas appropriately. Alternatively, electric discharge machining may be performed locally when the etching process is performed using atmospheric pressure discharge, in which case a mask layer is not required to be formed over the whole surface.

After the single crystal semiconductor layer 704 and the insulating layer 702 are patterned, a p-type impurity such as boron, aluminum, or gallium may be added in order to control a threshold voltage. For example, as the p-type impurity, boron can be added at a concentration of $5 \times 10^{16}$ cm$^{-3}$ to $1 \times 10^{18}$ cm$^{-3}$, inclusive.

Although not described in this embodiment mode, the structure in which an insulating layer serving as a barrier layer is provided over the substrate 700 having the insulating surface, may also be employed. For the insulating layer serving as a barrier layer, a stack of a silicon nitride film and a silicon oxide film may be used for example. By provision of the insulating layer serving as a barrier layer, the single crystal semiconductor layer 704 can be prevented from being contaminated by movable ions which are from the substrate 700 having the insulating surface. Note that silicon nitride oxide, aluminum nitride, or aluminum nitride oxide may be used instead of silicon nitride.

Figure 7B:
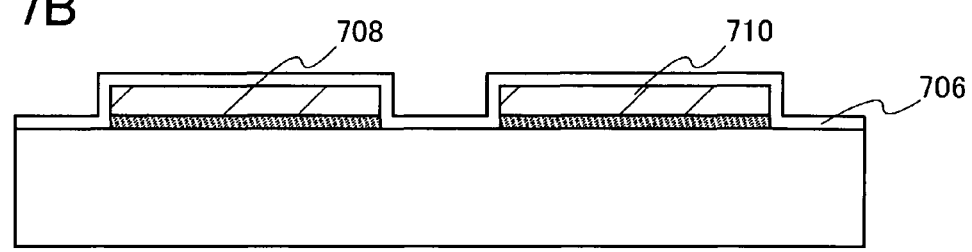
Figure 7C:
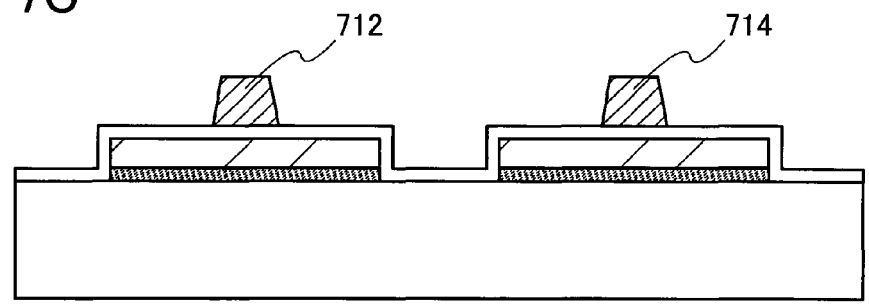
Figure 7D:
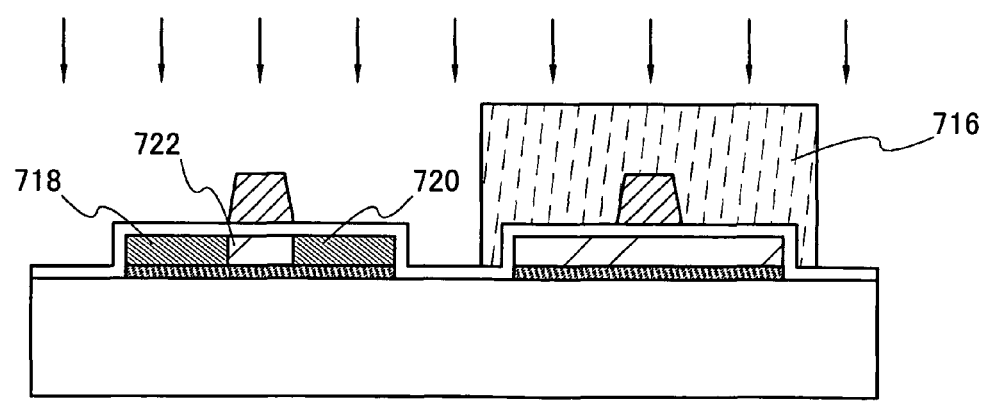
Figure 8A:
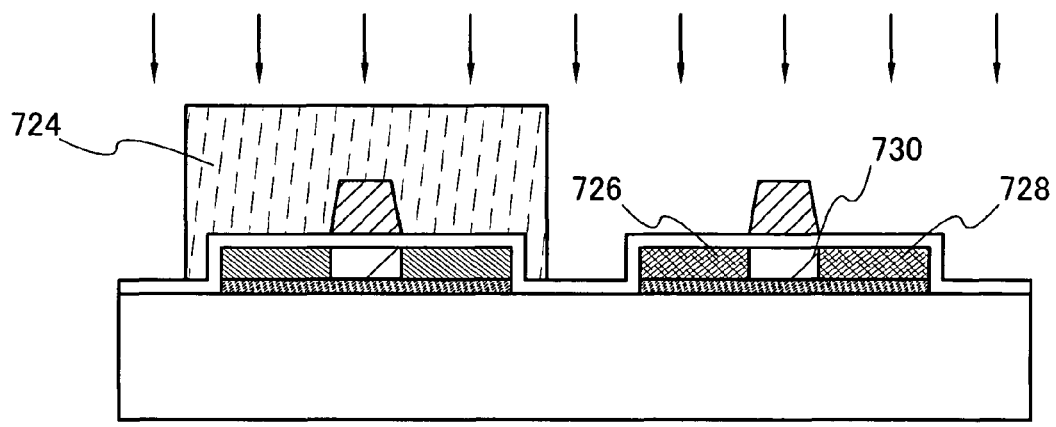
FIGS. 8A to 8C illustrate a manufacturing process of a semiconductor device of the present invention.
Figure 8B:
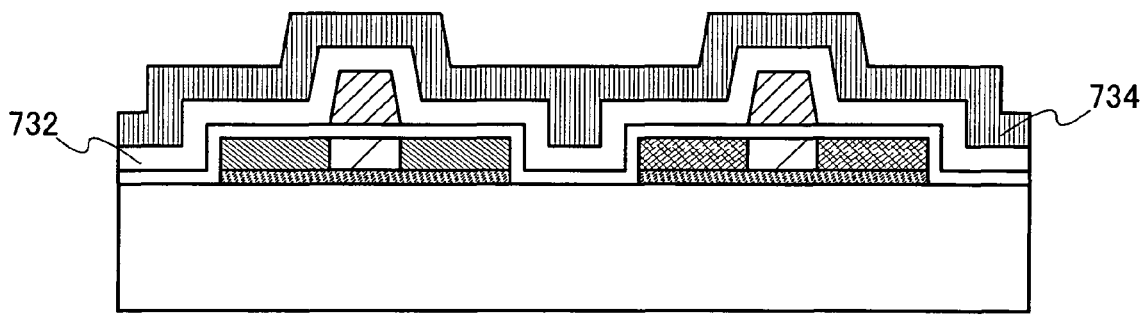
Figure 8C:
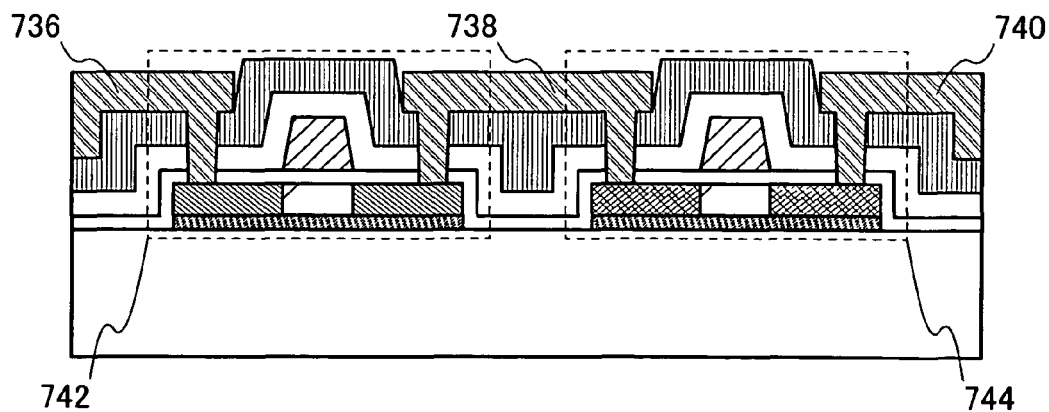

Next, a gate insulating layer 706 which covers the island-shaped single crystal semiconductor layers is formed (see FIG. 7B). Note that for convenience, the island-shaped single crystal semiconductor layers which are formed by patterning are referred to as a single crystal semiconductor layer 708 and a single crystal semiconductor layer 710.

The gate insulating layer 706 is formed of an insulating film containing silicon by a plasma CVD method, a sputtering method, or the like to have a thickness of approximately 10 nm to 150 nm. Specifically, the gate insulating layer 706 may be formed by using a material such as an oxide material or nitride material of silicon, typified by silicon nitride, silicon oxide, silicon oxynitride, or silicon nitride oxide. The gate insulating layer 706 may have a single-layer structure or a stacked structure. Further, a thin silicon oxide film with a thickness of 1 nm to 100 nm inclusive, preferably 1 nm to 10 nm inclusive, or more preferably 2 nm to 5 nm inclusive may be formed between the single crystal semiconductor layers and the gate insulating layer. Note that a rare gas element such as argon may be contained in a reaction gas in order to form a gate insulating layer with little leak current at a low temperature.

Next, a conductive film used for gate electrode layers is formed over the gate insulating layer 706. The thickness of the conductive film may be approximately equal to or greater than 50 nm and equal to or less than 400 nm. In addition, the conductive film can be formed by a sputtering method, an evaporation method, a CVD method, or the like. The conductive film may be formed of an element selected from tantalum, tungsten, titanium, molybdenum, aluminum, copper, chromium, neodymium, or the like, an alloy material or a compound material containing the element as its main component, or the like. An AgPdCu alloy, a semiconductor film typified by a polycrystalline silicon film that is doped with an impurity element such as phosphorus, or the like may also be used for the conductive film. Note that the single-layer structure is described in this embodiment mode; however, the present invention is not limited to this, and a stacked structure including two or more layers may also be used.

Then, a mask formed of a resist is formed by a photolithography method and the conductive film is processed into a desired shape using the mask. Accordingly, a gate electrode layer 712 and a gate electrode layer 714 are formed (see FIG. 7C). After formation of the gate electrode layer 712 and the gate electrode layer 714, the above-mentioned mask is removed.

In the processing of the conductive film, etching can be performed to form a desired tapered shape by an ICP (inductively coupled plasma) etching method with appropriate control of the etching conditions (e.g., the amount of electric power applied to a coiled electrode layer, the amount of electric power applied to an electrode layer on the substrate side, and the electrode temperature on the substrate side). An angle and the like of the tapered shape can also be controlled by the shape of the mask. As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Next, a mask 716 formed of a resist material is formed to cover the single crystal semiconductor layer 710 by a photolithography method. Then, an impurity element imparting n-type conductivity is added using the gate electrode layer 712 and the mask 716 as masks (see FIG. 7D). In this manner, an n-type impurity region 718, an n-type impurity region 720, and a channel formation region 722 are formed. In this embodiment mode, doping is performed using phosphine ($PH_3$) as a doping gas which contains an impurity element. Here, phosphorus (P) that is an impurity element imparting n-type conductivity is added at a concentration of about $1 \times 10^{17}$ atoms/cm$^3$ to $1 \times 10^{21}$ atoms/cm$^3$, inclusive.

Although not described in this embodiment mode, a so-called LDD (lightly doped drain) region may be provided. By provision of the LDD region which overlaps with a gate electrode layer, reduction in ON current due to hot carriers can be prevented. In addition, by provision of an LDD region which does not overlap with a gate electrode layer, OFF current can be reduced.

Next, the mask 716 is removed, and a mask 724 covering the single crystal semiconductor layer 708 is formed. Then, using the gate electrode layer 714 and the mask 724 as masks, an impurity element imparting p-type conductivity is added (see FIG. 8A). Accordingly, a p-type impurity region 726, a p-type impurity region 728, and a channel formation region 730 are formed. In this embodiment mode, doping is performed using diborane ($B_2H_6$) as a doping gas which contains an impurity element. Here, boron (B) that is an impurity element imparting p-type conductivity is added at a concentration of $1 \times 10^{18}$ atoms/cm$^3$ to $5 \times 10^{21}$ atoms/cm$^3$ inclusive. Further, similarly to the above, a so-called LDD region may also be provided. After adding the impurity element imparting p-type conductivity, the mask 724 is removed.

Then, an interlayer insulating layer is formed to cover the gate insulating layer 706, the gate electrode layer 712, and the gate electrode layer 714. In this embodiment mode, the interlayer insulating layer has a stacked structure of an insulating film 732 and an insulating film 734 (see FIG. 8B). For example, by a plasma CVD method, a silicon nitride oxide film with a thickness of 100 nm can be formed as the insulating film 732, and a silicon oxynitride film with a thickness of 900 nm can be formed as the insulating film 734. In this embodiment mode, the interlayer insulating layer has a two-layer structure; however, it may have a single-layer structure or a stacked structure including three or more layers. The materials for the insulating film 732 and the insulating film 734 are not limited to the above-described materials.

The insulating film 732 and the insulating film 734 can be formed using a material selected from silicon oxide, silicon nitride, aluminum oxide, aluminum nitride, aluminum oxynitride, aluminum nitride oxide having a higher content of nitrogen than that of oxygen, diamond-like carbon (DLC), a carbon film containing nitrogen, or other substances containing an inorganic insulating material. Alternatively, a siloxane resin may also be used. A siloxane resin is a resin including a Si—O—Si bond. Siloxane has a skeleton structure formed by a bond of silicon (Si) and oxygen (O). As a substituent, an organic group (e.g., an alkyl group or an aryl group) containing at least hydrogen is used. A fluoro group may be included in the organic group. An organic insulating material such as polyimide, acrylic, polyamide, polyimide amide, benzocyclobutene, or polysilazane can be used.

Next, contact holes (openings) are formed in the gate insulating layer 706, the insulating film 732, and the insulating film 734 by using a mask formed of a resist material. Then, a conductive film is formed so as to cover the openings and etched. Thus, a source or drain electrode layer 736, a source or drain electrode layer 738, and a source or drain electrode layer 740 are formed (see FIG. 8C). For the source or drain electrode layers, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, or tin; a compound or alloy material that contains one of the above-mentioned elements as its main component (e.g., indium tin oxide (ITO), indium zinc oxide (IZO), indium tin oxide that contains silicon oxide (ITSO), zinc oxide, aluminum-neodymium (Al—Nd), magnesium-silver (MgAg), or the like); a material that is a combination of any of these compounds; or the like can be used. In addition to what is given above, a silicide (e.g., aluminum-silicon, molybdenum-silicon, or nickel silicide), a compound that contains nitrogen (e.g., titanium nitride, tantalum nitride, or molybdenum nitride), silicon (Si) doped with an impurity element such as phosphorus (P) or the like, or the like may be used.

Through the above-described process, a complementary semiconductor device (a so-called CMOS) in which an n-channel transistor 742 and a p-channel transistor 744 are connected via the source or drain electrode layer 738 can be manufactured.

Figure 9A:
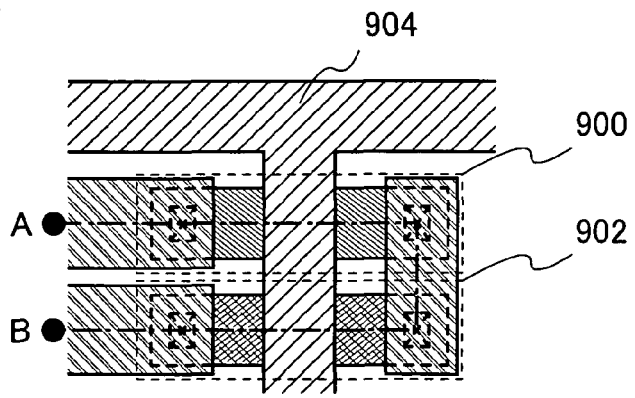
FIGS. 9A, 9B, and 9C are a plan view, a cross-sectional view, and a circuit diagram, respectively, of a semiconductor device of the present invention.
Figure 9B:
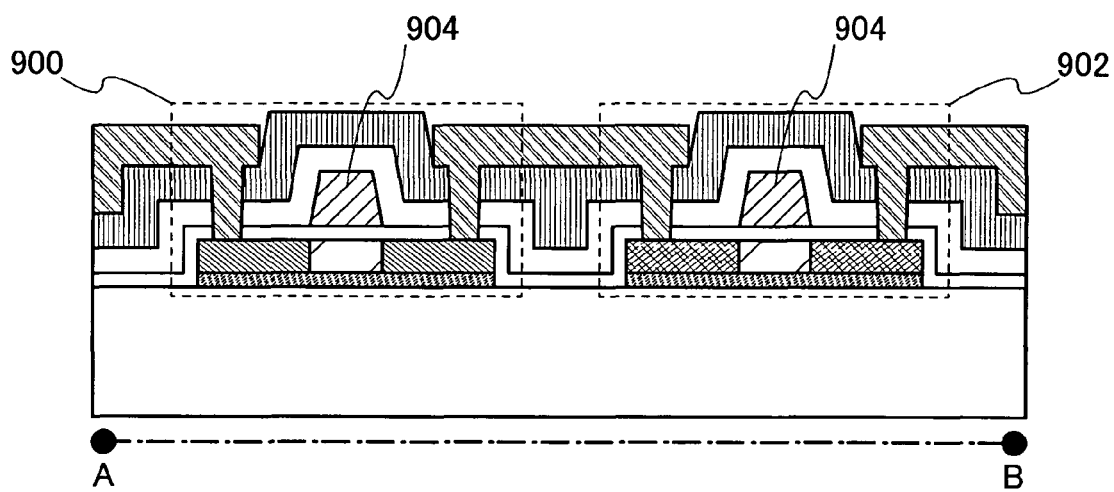
Figure 9C:
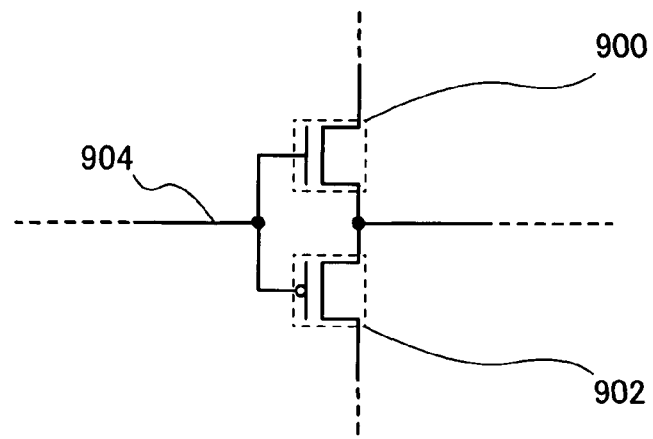

FIGS. 9A to 9C illustrate plan views and a cross-sectional view of a complementary semiconductor device manufactured by the above-described process. FIG. 9A is a plan view of the complementary semiconductor device, and FIG. 9B is a cross-sectional view of the complementary semiconductor device. Here, the cross section taken along line A-B in FIG. 9A corresponds to FIG. 9B. FIG. 9C is a circuit diagram of the complementary semiconductor device. In FIGS. 9A to 9C, an n-channel transistor 900 and a p-channel transistor 902 are connected to the same gate electrode 904 (also referred to as a gate wiring).

In the semiconductor device of the present invention, separation of a single crystal semiconductor layer from an insulating layer is suppressed by using a single crystal semiconductor layer having a (110) plane as a main surface. In addition, by using the (110) plane, flatness of the single crystal semiconductor layer surface is improved.

Further, transistors are manufactured so that the channel length direction is disposed in a <110> axis direction in the semiconductor device of the present invention, which can maximize mobility of the p-channel transistor. Accordingly, the layout can be optimized and miniaturization of the semiconductor device can be realized.

In the case of using the (110) plane, there is a possibility of causing a problem of defects at the interface with an insulating layer, as compared to the case of using the (100) plane. If this problem really occurs, plasma treatment may be performed, for example, on the surface of the single crystal semiconductor layer, thereby the problem can be solved.

By using the present invention in this manner, the semiconductor device can have improved reliability and be miniaturized.

This embodiment mode can be implemented in combination with Embodiment Mode 1 or 2 as appropriate.

Embodiment Mode 4

In Embodiment Mode 4, an example of a manufacturing method of a semiconductor device of the present invention will be described with reference to FIGS. 10A to 10D, FIGS. 1A to 11C, FIGS. 12A to 12C, and FIGS. 13A and 13B. Note that a liquid crystal display device is taken as an example of a semiconductor device in this embodiment mode; however, the semiconductor device of the present invention is not limited to the liquid crystal display device.

First, a single crystal semiconductor layer having a (110) plane as a main surface is formed over a substrate having an insulating surface by the method described in Embodiment Mode 1, or the like (see FIG. 10A). Here a structure in which an insulating layer 1002 serving as a barrier layer, an insulating layer 1004 serving as a bonding layer, and a single crystal semiconductor layer 1006 are sequentially provided over a substrate 1000 having an insulating surface is described; however, the present invention is not limited to this. Then, the single crystal semiconductor layer 1006 and the insulating layer 1004 are patterned into a desired shape to form island-shaped semiconductor layers. At this time, the island-shaped semiconductor layers are formed so that the channel length direction of transistors to be formed later is the <110> axis direction.

As to an etching process in the patterning, either plasma etching (dry etching) or wet etching may be employed. In the case of processing a large-sized substrate, plasma etching is suitable. As an etching gas, a fluorine-based gas or a chlorine-based gas such as $CF_4$, $NF_3$, $Cl_2$, $BCl_3$, or the like is used. An inert gas such as He or Ar may be added to the etching gas appropriately. Alternatively, electric discharge machining may be performed locally when the etching process is performed using atmospheric pressure discharge, in which case a mask layer is not required to be formed over the whole surface.

After the single crystal semiconductor layer 1006 and the insulating layer 1004 are patterned, a p-type impurity such as boron, aluminum, or gallium may be added in order to control a threshold voltage. For example, as the p-type impurity, boron can be added at a concentration of $5 \times 10^{16}$ $cm^{-3}$ to $1 \times 10^{18}$ $cm^{-3}$, inclusive.

For the insulating layer 1002, a silicon nitride film and a silicon oxide film are formed over the substrate 1000 having the insulating surface to have a stacked structure. By provision of the insulating layer 1002, the single crystal semiconductor layer 1006 can be prevented from being contaminated by movable ions. Note that silicon nitride oxide, aluminum nitride, or aluminum nitride oxide may be used instead of silicon nitride.

Next, a gate insulating layer 1008 which covers the island-shaped semiconductor layers is formed (see FIG. 10B). Note that for convenience, the island-shaped single crystal semiconductor layers which are formed by patterning are referred to as a single crystal semiconductor layer 1010, a single crystal semiconductor layer 1012, and a single crystal semiconductor layer 1014. The gate insulating layer 1008 is formed of an insulating film containing silicon by a plasma CVD method, a sputtering method, or the like to have a thickness of approximately 10 nm to 150 nm inclusive. Specifically, the gate insulating layer 1008 may be formed by using a material such as an oxide material or a nitride material of silicon, typified by silicon nitride, silicon oxide, silicon oxynitride, or silicon nitride oxide. The gate insulating layer 1008 may have a single-layer structure or a stacked structure. Further, a thin silicon oxide film with a thickness of equal to or greater than 1 nm and equal to or less than 100 nm, preferably equal to or greater than 1 nm and equal to or less than 10 nm, or more preferably equal to or greater than 2 nm and equal to or less than 5 nm may be formed between the single crystal semiconductor layers and the gate insulating layer. Note that a rare gas element such as argon may be contained in a reaction gas in order to form a gate insulating layer with little leak current at a low temperature.

Next, a first conductive film and a second conductive film which are used for gate electrode layers are stacked over the gate insulating layer 1008. The thickness of the first conductive film may be approximately equal to or greater than 20 nm and equal to or less than 100 nm, and the thickness of the second conductive film may be approximately equal to or greater than 100 nm and equal to or less than 400 nm. In addition, the first conductive film and the second conductive film can be formed by a sputtering method, an evaporation method, a CVD method, or the like. The first conductive film and the second conductive film may be formed of an element selected from tantalum, tungsten, titanium, molybdenum, aluminum, copper, chromium, neodymium, or the like, an alloy material or a compound material containing the element as its main component, or the like. An AgPdCu alloy, a semiconductor film typified by a polycrystalline silicon film that is doped with an impurity element such as phosphorus, or the like may also be used for the first conductive film and the second conductive film. Note that the two-layer structure is described in this embodiment mode; however, the present invention is not limited to this, and a stacked structure including three or more layers or a single-layer structure may also be employed.

Then, a photolithography method is used to form masks 1016a, 1016b, 1016c, 1016d, and 1016e each formed of a resist material. The first conductive film and the second conductive film are processed into a desired shape using the above masks, thereby forming a first gate electrode layer 1018a, a first gate electrode layer 1018b, a first gate electrode layer 1018c, a first gate electrode layer 1018d, a first conductive layer 1018e, a conductive layer 1020a, a conductive layer 1020b, a conductive layer 1020c, a conductive layer 1020d, and a conductive layer 1020e (see FIG. 10C).

Here, etching can be performed to form a desired tapered shape by an ICP (inductively coupled plasma) etching method with appropriate control of the etching conditions (e.g., the amount of electric power applied to a coiled electrode layer, the amount of electric power applied to an electrode layer on the substrate side, and the electrode temperature on the substrate side). An angle and the like of the tapered shape can also be controlled by the shape of the masks. As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used. In this embodiment mode, etching of the second conductive film is performed using an etching gas containing $CF_4$, $Cl_2$, and $O_2$, and etching of the first conductive film is sequentially performed using an etching gas containing $CF_4$ and $Cl_2$.

Next, the conductive layer 1020a, the conductive layer 1020b, the conductive layer 1020c, the conductive layer 1020d, and the conductive layer 1020e are processed into a desired shape by using the masks 1016a, 1016b, 1016c, 1016d, and 1016e. At this time, etching is performed with an etching condition of high selectivity between the second conductive film, which forms the conductive layers, and the first conductive film, which forms the first gate electrode layers and the first conductive layer. By this etching, a second gate electrode layer 1022a, a second gate electrode layer 1022b, a second gate electrode layer 1022c, a second gate electrode layer 1022d, and a second conductive layer 1022e are formed. In this embodiment mode, the second gate electrode layers and the second conductive layer also have a tapered shape, and the respective taper angles are larger than the taper angles of the first gate electrode layers 1018a, 1018b, 1018c, and 1018d and the first conductive layer 1018e. Here, the term "taper angle" refers to an angle between a bottom surface with a side surface of an object. Thus, when the taper angle is 90°, the conductive layer has a perpendicular side surface to the bottom surface. By setting the taper angle at an angle smaller than 90°, coverage of a film to be stacked thereover is improved and defects can be reduced. In this embodiment mode, $Cl_2$, $SF_6$, and $O_2$ are used as an etching gas for forming the second gate electrode layers and the second conductive layer.

Through the above-described process, a gate electrode layer 1024a and a gate electrode layer 1024b can be formed in a peripheral driver circuit region 1080, and a gate electrode layer 1024c, a gate electrode layer 1024d, and a conductive layer 1024e can be formed in a pixel region 1082 (see FIG. 10D). Note that the masks 1016a, 1016b, 1016c, 1016d, and 1016e are removed after the above-described process.

Next, an impurity element imparting n-type conductivity is added using the gate electrode layer 1024a, the gate electrode layer 1024b, the gate electrode layer 1024c, and the gate electrode layer 1024d as masks, so that a first n-type impurity region 1026a, a first n-type impurity region 1026b, a first n-type impurity region 1028a, a first n-type impurity region 1028b, a first n-type impurity region 1030a, a first n-type impurity region 1030b, and a first n-type impurity region 1030c are formed (see FIG. 11A). In this embodiment mode, doping is performed using phosphine ($PH_3$) as a doping gas which contains an impurity element. Here, phosphorus (P) that is an impurity element imparting n-type conductivity is added at a concentration of about $1\times10^{16}$ atoms/cm$^3$ to $5\times10^{19}$ atoms/cm$^3$ inclusive.

Next, a mask 1032a, a mask 1032b, and a mask 1032c which cover the single crystal semiconductor layer 1010 and part of the single crystal semiconductor layer 1014 are formed. Then, an impurity element imparting n-type conductivity is added using the mask 1032a, the mask 1032b, the mask 1032c, and the second gate electrode layer 1022b as masks. As a result, a second n-type impurity region 1034a, a second n-type impurity region 1034b, a third n-type impurity region 1036a, a third n-type impurity region 1036b, a second n-type impurity region 1040a, a second n-type impurity region 1040b, a second n-type impurity region 1040c, a third n-type impurity region 1042a, a third n-type impurity region 1042b, a third n-type impurity region 1042c, and a third n-type impurity region 1042d are formed. In this embodiment mode, doping is performed by using phosphine (PH$_3$) as a doping gas containing an impurity element. Here, phosphorus (P) that is an impurity element imparting n-type conductivity is added to the second n-type impurity regions at a concentration of about $1\times10^{17}$ atoms/cm$^3$ to $1\times10^{21}$ atoms/cm$^3$ inclusive. The third n-type impurity region 1036a and the third n-type impurity region 1036b are formed to contain the impurity element imparting n-type conductivity at the same concentration as or at a slightly higher concentration than the third n-type impurity region 1042a, the third n-type impurity region 1042b, the third n-type impurity region 1042c, and the third n-type impurity region 1042d. In addition, a channel formation region 1038, a channel formation region 1044a, and a channel formation region 1044b are formed (see FIG. 11B).

The second n-type impurity regions are high-concentration impurity regions and function as a source or a drain. On the other hand, the third n-type impurity regions are low-concentration impurity regions and function as so-called LDD (lightly doped drain) regions. The third n-type impurity region 1036a and the third n-type impurity region 1036b are formed in regions which are overlapped with the first gate electrode layer 1018b. Accordingly, an electric field around a source or a drain can be relieved and deterioration of ON current due to hot carriers can be prevented. On the other hand, each of the third n-type impurity region 1042a, the third n-type impurity region 1042b, the third n-type impurity region 1042c, and the third n-type impurity region 1042d is not overlapped with the gate electrode layer 1024c or the gate electrode layer 1024d; thus, an effect of reducing OFF current can be obtained.

Next, the mask 1032a, the mask 1032b, and the mask 1032c are removed, and a mask 1046a and a mask 1046b which cover the single crystal semiconductor layer 1012 and the single crystal semiconductor layer 1014 are formed. Then, using the mask 1046a, the mask 1046b, and the gate electrode layer 1024a as masks, an impurity element imparting p-type conductivity is added. Accordingly, a first p-type impurity region 1048a, a first p-type impurity region 1048b, a second p-type impurity region 1050a, and a second p-type impurity region 1050b are formed. In this embodiment mode, doping is performed using diborane (B$_2$H$_6$) as a doping gas which contains an impurity element. Here, boron (B) that is an impurity element imparting p-type conductivity is added to the first p-type impurity regions and the second p-type impurity regions at a concentration of about $1\times10^{18}$ atoms/cm$^3$ to $5\times10^{21}$ atoms/cm$^3$ inclusive. Further, a channel formation region 1052 is formed (see FIG. 11C).

The first p-type impurity regions are high-concentration impurity regions and function as a source or a drain. On the other hand, the second p-type impurity regions are low-concentration impurity regions and function as so-called LDD (lightly doped drain) regions.

Then, the mask 1046a and the mask 1046b are removed. After the masks are removed, an insulating film may be formed to cover side surfaces of the gate electrode layers. The insulating film can be formed by a plasma CVD method or a low-pressure CVD (LPCVD) method. Heat treatment, intense light irradiation, laser light irradiation, or the like may be performed to activate the impurity elements.

Then, an interlayer insulating layer is formed to cover the gate electrode layers and the gate insulating layer. In this embodiment mode, the interlayer insulating layer has a stacked structure of an insulating film 1054 and an insulating film 1056 (see FIG. 12A). A silicon nitride oxide film with a thickness of 100 nm is formed as the insulating film 1054, and a silicon oxynitride film with a thickness of 900 nm is formed as the insulating film 1056. In this embodiment mode, the interlayer insulating layer has a two-layer structure; however, it may have a single-layer structure or a stacked structure including three or more layers. In this embodiment mode, the insulating film 1054 and the insulating film 1056 are sequentially formed by a plasma CVD method without being exposed to air. The materials for the insulating film 1054 and the insulating film 1056 are not limited to the above-described materials.

The insulating film 1054 and the insulating film 1056 can be formed using a material selected from silicon oxide, silicon nitride, aluminum oxide, aluminum nitride, aluminum oxynitride, aluminum nitride oxide having a higher content of nitrogen than that of oxygen, diamond-like carbon (DLC), a carbon film containing nitrogen, or other substances containing an inorganic insulating material. Alternatively, a siloxane resin may also be used. A siloxane resin is a resin including a Si—O—Si bond. Siloxane has a skeleton structure formed by a bond of silicon (Si) and oxygen (O). As a substituent, an organic group (e.g., an alkyl group or an aryl group) containing at least hydrogen is used. A fluoro group may be included in the organic group. An organic insulating material such as polyimide, acrylic, polyamide, polyimide amide, benzocyclobutene, or polysilazane can be used.

Next, contact holes (openings) that reach the single crystal semiconductor layers and the gate electrode layers are formed in the insulating film 1054, the insulating film 1056, and the gate insulating layer 1008, using a mask formed of a resist material. Etching may be performed once or a plurality of times depending on a selection ratio of a material to be used. In this embodiment mode, first etching is performed with a condition that selectivity of the insulating film 1056 that is a silicon oxynitride film to the insulating film 1054 that is a silicon nitride oxide film is high, so that the insulating film 1056 is removed. Next, the insulating film 1054 and the gate insulating layer 1008 are removed by second etching, and openings each of which reaches a source or a drain are formed Then, a conductive film is formed to cover the openings, and the conductive film is etched. Therefore, a source or drain electrode layer 1058a, a source or drain electrode layer 1058b, a source or drain electrode layer 1060a, a source or drain electrode layer 1060b, a source or drain electrode layer 1062a, and a source or drain electrode layer 1062b, each of which is electrically connected to part of a source region or a drain region, are formed. For the source or drain electrode layers, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, or tin; a compound or alloy material that contains one of the above-mentioned elements as its main component (e.g., indium tin oxide (ITO), indium zinc oxide (IZO), indium tin oxide that contains silicon oxide (ITSO), zinc oxide, aluminum-neodymium (Al—Nd), magnesium-silver (MgAg), or the like); a material that is a combination of any of these compounds; or the like can be used. In addition to what is given above, a silicide (e.g., aluminum-silicon, molybdenum-silicon, or nickel silicide), a compound that contains nitrogen (e.g., titanium nitride, tantalum nitride, or molybdenum nitride), silicon (Si) doped with an impurity element such as phosphorus (P) or the like, or the like can be used.

Figures 12A, 12B, 12C:
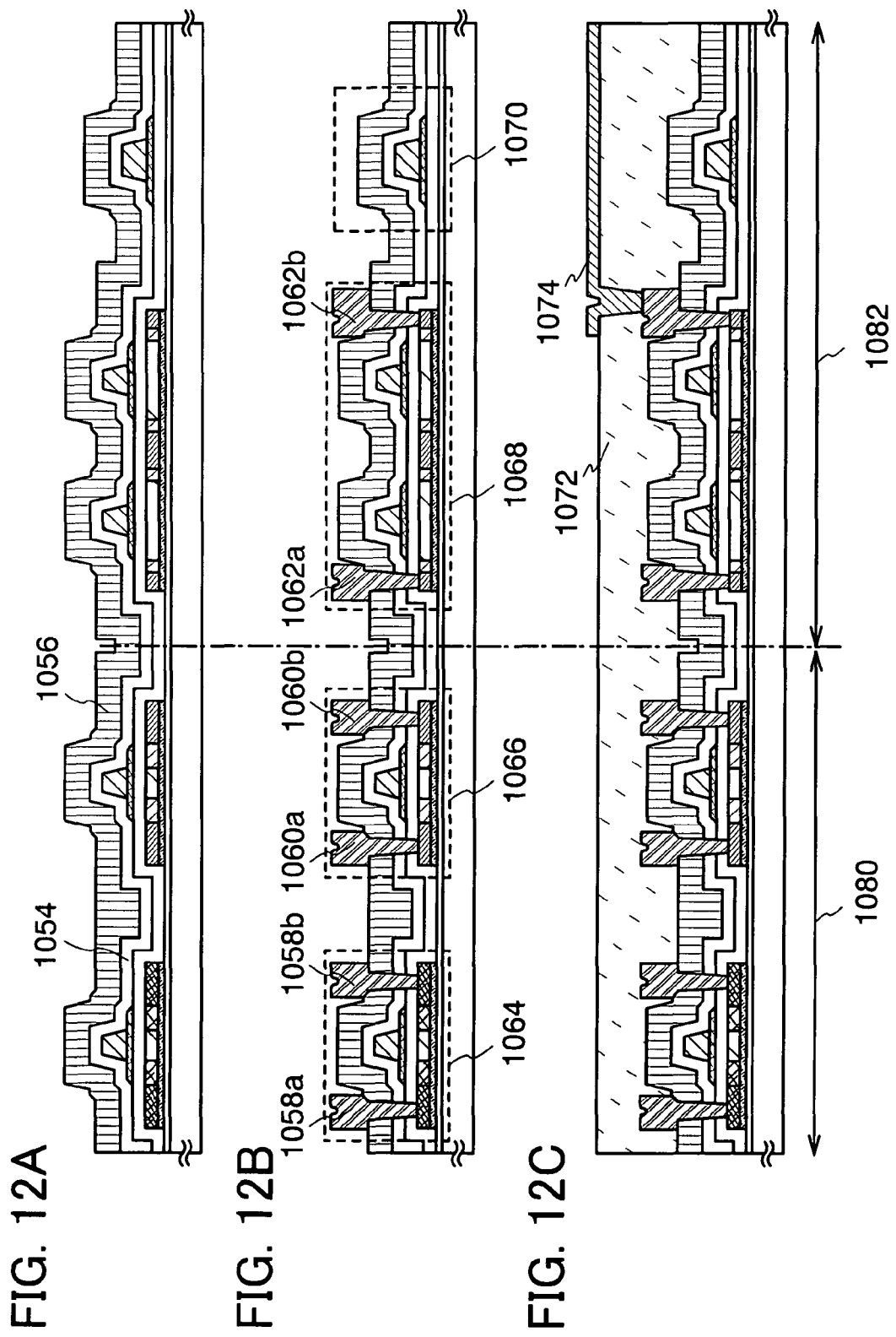
FIGS. 12A to 12C illustrate a manufacturing process of a semiconductor device of the present invention.

Through the above-described process, a p-channel thin film transistor 1064 and an n-channel thin film transistor 1066 are formed in a peripheral driver circuit region 1080, and an n-channel thin film transistor 1068 and a capacitor wiring 1070 are formed in a pixel region 1082 (see FIG. 12B).

Next, an insulating film 1072 is formed as a second interlayer insulating layer. The insulating film 1072 can be formed of a material selected from silicon oxide, silicon nitride, silicon oxynitride, silicon nitride oxide, aluminum oxide, aluminum nitride, aluminum oxynitride, aluminum nitride oxide containing more nitrogen than oxygen, diamond-like carbon (DLC), a nitrogen-containing carbon film, phosphosilicate glass (PSG), borophosphosilicate glass (BPSG), an alumina film, polysilazane, or other substances containing an inorganic insulating material. Alternatively, a siloxane resin may also be used. An organic insulating material such as polyimide, acrylic, polyamide, polyimide amide, or benzocyclobutene can be used.

Next, a contact hole is formed in the insulating film 1072 in the pixel region 1082, and a pixel electrode layer 1074 is formed (see FIG. 12C). The pixel electrode layer 1074 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition containing a conductive high molecular compound (also referred to as a conductive polymer) can also be used for the pixel electrode layer 1074. A thin film of the conductive composition preferably has a sheet resistance of equal to or less than 10000 ohms per square. In the case where a thin film is formed as a light-transmitting pixel electrode layer, it is preferable that light transmittance at a wavelength of 550 nm be 70% or more. Further, it is preferable that a conductive high molecular compound included in a conductive composition have resistance of 0.1 Ω·cm or lower.

As the conductive high molecular compound, a so-called π electron conjugated conductive high molecular compound can be used. For example, polyaniline and a derivative thereof, polypyrrole and a derivative thereof, polythiophene and a derivative thereof, and a copolymer of those materials can be given.

Specific examples of the conjugated conductive high molecular compound are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The above conductive high molecular compound may be used alone, or an organic resin may be added thereto in order to adjust the characteristic of the film.

As for an organic resin, as long as a resin can be compatible to or mixed and dispersed into a conductive high molecular compound, a thermosetting resin, a thermoplastic resin, or a photocurable resin may be used. Specific examples of the organic resin are given below: a polyester-based resin such as polyethylene terephthalate, polybutylene terephthalate, or polyethylene naphthalate; a polyimide-based resin such as polyimide or polyamide imide; a polyamide resin such as polyamide6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of those resins.

Furthermore, by doping a conductive composition with acceptor type dopant or donor type dopant, an oxidation-reduction potential of a conjugated electron of a conjugated conductive high molecular compound is changed; therefore, electrical conductivity may be adjusted.

As the acceptor type dopant, a halogen compound, a Lewis acid, a protonic acid, an organic cyano compound, an organic metal compound, or the like can be used. Examples of a halogen compound are chlorine, bromine, iodine, iodine chloride, iodine bromide, iodine fluoride, and the like. As examples of a Lewis acid, phosphorus pentafluoride, arsenic pentafluoride, antimony pentafluoride, boron trifluoride, boron trichloride, boron tribromide, and the like can be given. Examples of a protonic acid are an inorganic acid such as a hydrochloric acid, a sulfuric acid, a nitric acid, a phosphoric acid, a fluoroboric acid, a hydrofluoric acid, and a perchloric acid, and an organic acid such as an organic carboxylic acid and an organic sulfonic acid. As the organic carboxylic acid and the organic sulfonic acid, a carboxylic acid compound or a sulfonic acid compound can be used. As the organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene can be given.

As the donor type dopant, an alkali metal, an alkaline earth metal, a quaternary amine compound, or the like can be used.

The aforementioned conductive composition is dissolved in water or an organic solvent (e.g., an alcohol-based solvent, a ketone-based solvent, an ester-based solvent, a hydrocarbon-based solvent, or an aromatic-based solvent) and a thin film which serves as the pixel electrode layer 1074 can be formed by an application method, a coating method, a droplet discharge method (also referred to as an ink-jet method), a printing method, or the like.

Figure 13A:
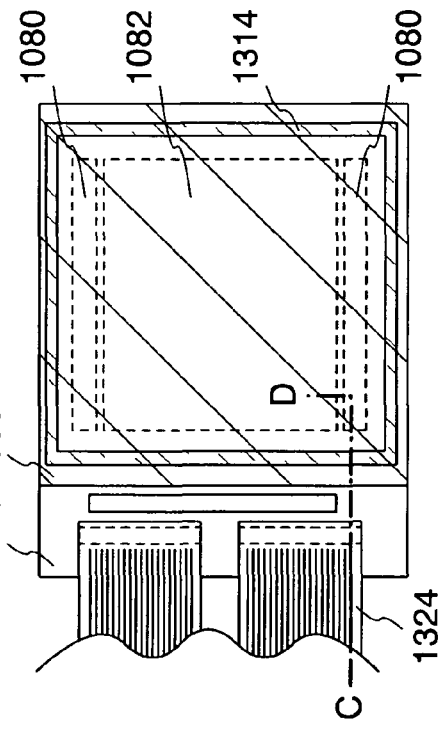
FIGS. 13A and 13B are a plan view and a cross-sectional view, respectively, of a semiconductor device of the present invention.
Figure 13B:
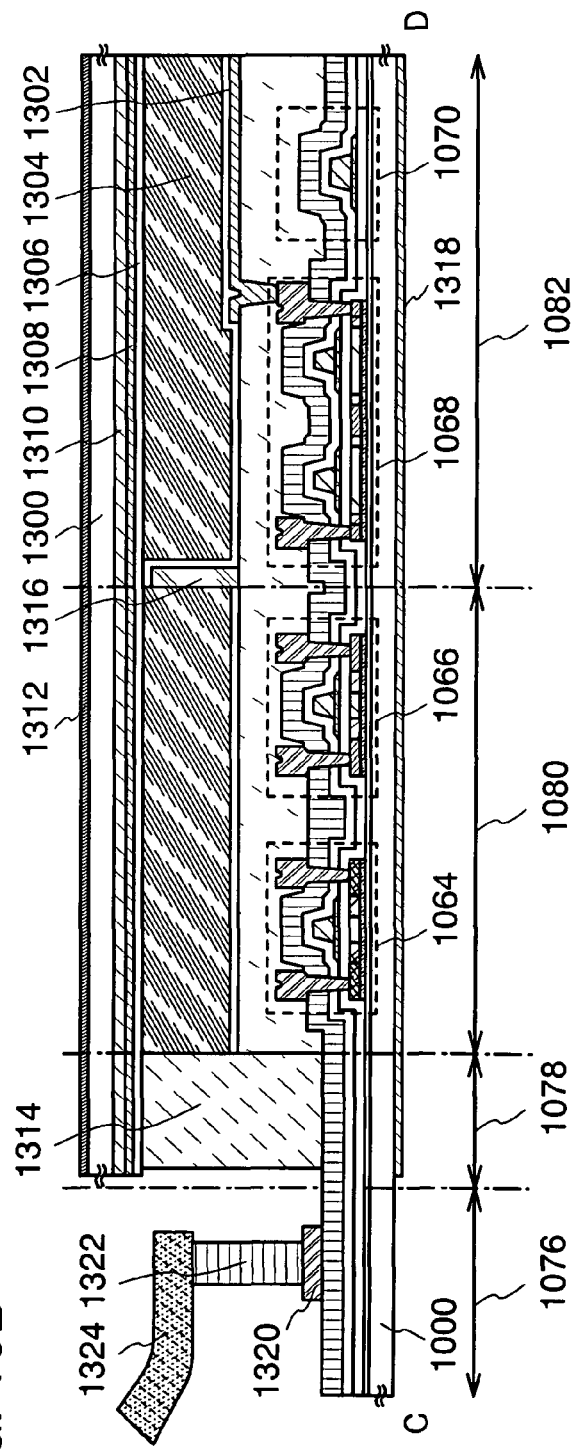

Next, an insulating layer 1302 which is referred to as an alignment film is formed so as to cover the pixel electrode layer 1074 and the insulating film 1072 (see FIG. 13B). The insulating layer 1302 can be formed by a screen printing method or an offset printing method. FIGS. 13A and 13B are a plan view and a cross-sectional view of a semiconductor device. FIG. 13A is a plan view of the semiconductor device, and FIG. 13B is a cross-sectional view taken along a line C-D of FIG. 13A. The semiconductor device includes an external terminal connection region 1076, a sealing region 1078, a peripheral driver circuit region 1080, and a pixel region 1082.

After forming the insulating layer 1302, rubbing treatment is performed. An insulating layer 1306 which serves as an alignment film can be formed in a similar manner to the insulating layer 1302.

After that, a counter substrate 1300 and the substrate 1000 having the insulating surface are attached to each other, with a sealant 1314 and a spacer 1316 interposed therebetween, and the space therebetween is provided with a liquid crystal layer 1304. The counter substrate 1300 is provided with the insulating layer 1306 which serves as an alignment film, a conductive layer 1308 which serves as a counter electrode, a colored layer 1310 which serves as a color filter, a polarizer 1312 (also referred to as a polarizing plate), and the like. Note that the substrate 1000 having the insulating surface is provided with a polarizer 1318 (polarizing plate); however, the present invention is not limited thereto. For example, in a reflective liquid crystal display device, a polarizer may be provided for either one of a counter substrate or a substrate having an insulating surface.

Next, an FPC 1324 is connected to a terminal electrode layer 1320 which is electrically connected to the pixel region, through an anisotropic conductive layer 1322. The FPC 1324 has a function of transmitting a signal from the external. The liquid crystal display device can be manufactured by the above-described process.

In the present invention, separation of a single crystal semiconductor layer from an insulating layer is suppressed by using a single crystal semiconductor layer having a (110) plane as a main surface. In addition, by using the (110) plane, flatness of the single crystal semiconductor layer is improved. Thus, reliability of a semiconductor device can be improved by using the present invention.

Further, when transistors are manufactured using the single crystal semiconductor layer having a (110) plane as a main surface so that the channel length direction is disposed in a <110> axis direction as in the semiconductor device of the present invention, mobility of a p-channel transistor can be maximized. Accordingly, the layout can be optimized and the semiconductor device can be miniaturized. In a semiconductor device like the liquid crystal display device described in this embodiment mode, a region except for a display region can be minimized by applying the present invention to a peripheral driver circuit region for example. That is, a region corresponding to a frame can be minimized and the display region can be used as efficiently as possible.

Note that there is no need to manufacture a transistor in a pixel region by using a single crystal semiconductor layer. However, even in the case of using a single crystal semiconductor layer, the channel length direction is not necessarily disposed in the <110> axis direction. Since the present invention is particularly effective in the case of forming both an n-channel transistor and a p-channel transistor, the structure of the present invention need not be applied for the case of forming only n-channel transistors. Needless to say, in the case where the effect of the present invention can be obtained such as the case of forming both an n-channel transistor and a p-channel transistor, it is preferable to apply transistors, in which the channel length direction is disposed in the <110> axis direction, to a pixel region. In this case, the layout can be optimized, and accordingly, the aperture ratio can be improved. Note that in the case where a single crystal semiconductor layer is not used for a pixel region, an amorphous semiconductor layer, a microcrystal semiconductor layer, a polycrystalline semiconductor layer, or the like can be formed as appropriate.

In the present invention, mobility of a p-channel transistor is maximized, and mobility of an n-channel transistor is suppressed to a certain value or less. Therefore, the mobility $\mu_n$ of the n-channel transistor and the mobility $\mu_p$ of the p-channel transistor generally satisfy the relation: $\mu_p \leq \mu_n \leq 2\mu_p$. In consideration of the possibility that the p-channel transistor and the n-channel transistor have different S values, in the case of manufacturing transistors both having the same or close level of current driving capability, the relation: $W_n/L_n:W_p/L_p=1:x$ (typically, $0.8 \leq x \leq 2$, preferably $1 \leq x \leq 1.5$, more preferably $1 \leq x \leq 1.2$) can be satisfied, where $L_n$ is the channel length of the n-channel transistor, $W_n$ is the channel width of the n-channel transistor, $L_p$ is the channel length of the p-channel transistor, and $W_p$ is the channel width of the p-channel transistor. Here, "the channel length" is a length (width) of a channel formation region in a direction parallel to the direction in which carriers flow. In addition, "the channel width" is a length (width) of a channel formation region in a direction perpendicular to the direction in which carriers flow.

In the case of using the (110) plane, there is a possibility of causing a problem of defects at the interface with an insulating layer, as compared to the case of using the (100) plane. If this problem really occurs, plasma treatment may be performed, for example, on the surface of the single crystal semiconductor layer, thereby the problem can be solved. Accordingly, a semiconductor device with high reliability can be provided.

By using the present invention in this manner, the semiconductor device can have improved reliability, and the semiconductor device (or part of it) can be miniaturized.

Note that a manufacturing method of a liquid crystal display device is described in this embodiment mode; however, the present invention is not limited to this. This embodiment mode can be implemented in combination with any of Embodiment Modes 1 to 3, as appropriate.

Embodiment Mode 5

In Embodiment Mode 5, a semiconductor device having a light-emitting element according to the present invention (an electroluminescent display device) will be described. Note that as to a manufacturing method of transistors used for a peripheral circuit region, a pixel region, and the like, it is possible to refer to Embodiment Mode 3; thus, the details are omitted.

In a semiconductor device having a light emitting element, any manner of bottom emission, top emission, or dual emission is used. In this embodiment mode, a semiconductor device using bottom emission is described with reference to FIGS. 14A and 14B; however, the present invention is not limited to this.

Figure 14A:
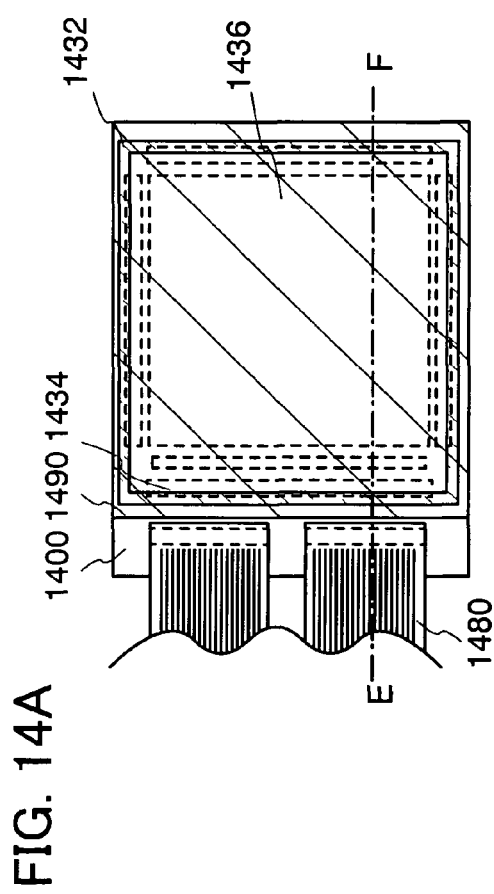
FIGS. 14A and 14B are a plan view and a cross-sectional view, respectively, of a semiconductor device of the present invention.
Figure 14B:
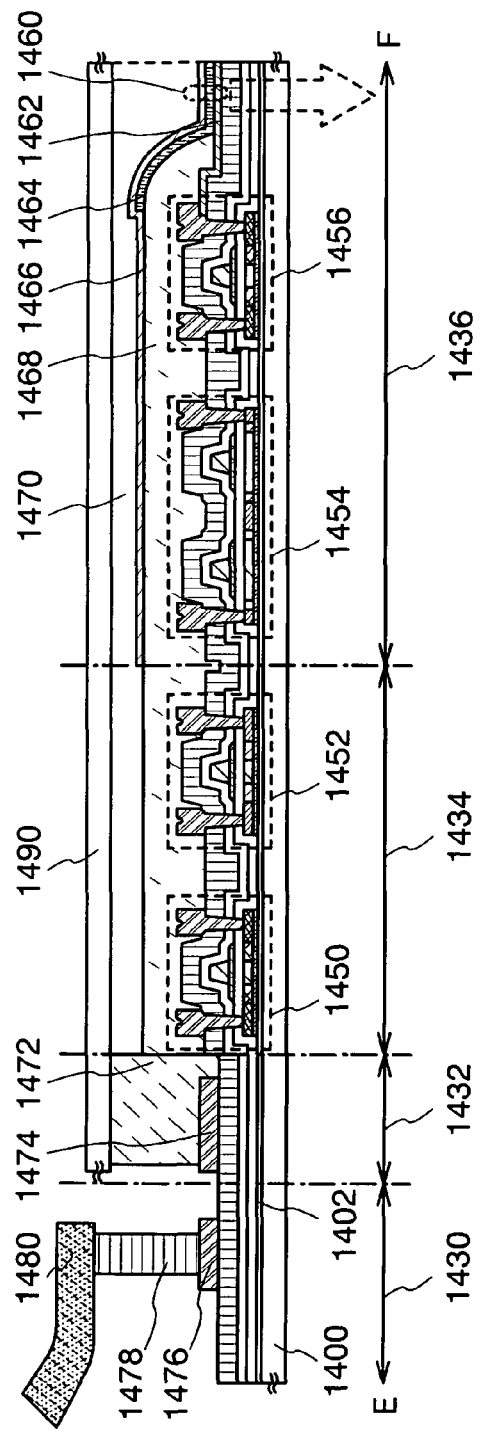

The semiconductor device in FIGS. 14A and 14B emits light to the lower side (in the direction of an arrow illustrated in the drawing). Here, FIG. 14A is a plan view of a semiconductor device, and FIG. 14B is a cross-sectional view taken along a line E-F of FIG. 14A. In FIGS. 14A and 14B, the semiconductor device includes an external terminal connection region 1430, a sealing region 1432, a driver circuit region 1434, and a pixel region 1436.

The semiconductor device illustrated in FIGS. 14A and 14B includes an element substrate 1400, an insulating film 1402, a thin film transistor 1450, a thin film transistor 1452, a thin film transistor 1454, and a thin film transistor 1456, a light-emitting element 1460, an insulating layer 1468, a filler 1470, a sealant 1472, a wiring layer 1474, a terminal electrode layer 1476, an anisotropic conductive layer 1478, an FPC 1480, and a sealing substrate 1490. Note that the light emitting element 1460 includes a first electrode layer 1462, a light-emitting layer 1464, and a second electrode layer 1466.

For the first electrode layer 1462, a light-transmitting conductive material is used so that light emitted from the light-emitting layer 1464 can be transmitted. On the other hand, as the second electrode layer 1466, a conductive material which can reflect light emitted from the light-emitting layer 1464 is used.

As the first electrode layer 1462, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide added with silicon oxide (ITSO), or the like can be used.

As the first electrode layer 1462, a conductive composition including a conductive high molecular compound (also referred to as a conductive polymer) can be used. Since the description in Embodiment Mode 3 can be referred to for details, description is omitted here.

As the second electrode layer 1466, a conductive film formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range, and an aluminum film is used in this embodiment mode.

In the case of applying top emission or dual emission, the design of an electrode layer may be changed, as appropriate. Specifically, in the case of top emission, the first electrode layer 1462 is formed using a reflective material, and the second electrode layer 1466 is formed using a light-transmitting material. In the case of dual emission, the first electrode layer 1462 and the second electrode layer 1466 may be formed using a light-transmitting material. Note that in the case of applying bottom emission or top emission, a structure may be such that one electrode layer is formed using a light-transmitting material, and the other electrode layer is formed to have a stacked-layer structure using a light-transmitting material and a light reflective material. A material which can be used for forming the electrode layer is similar to that in the case of employing the bottom emission; therefore, description is omitted.

Note that even a material, such as a metal, which is generally considered not to have a light-transmitting property, can transmit light by reduction of the film thickness (approximately equal to or greater than 5 nm and equal to or less than 30 nm). Accordingly, an electrode layer which transmits light can also be formed using the above-described light reflective material.

The sealing substrate 1490 may be provided with a color filter (colored layer). The color filter (colored layer) can be formed by an evaporation method or a droplet discharge method. Furthermore, a color conversion layer may be used.

In the present invention, separation of the single crystal semiconductor layer from the insulating film 1402 is suppressed by using a single crystal semiconductor layer having a (110) plane as a main surface. In addition, by using the (110) plane, flatness of the single crystal semiconductor layer is improved. Thus, reliability of a semiconductor device can be improved by using the present invention.

Further, when transistors are manufactured using the single crystal semiconductor layer having a (110) plane as a main surface so that the channel length direction is disposed in a <110> axis direction as in the semiconductor device of the present invention, mobility of a p-channel transistor can be maximized. Accordingly, the layout can be optimized and the semiconductor device can be miniaturized. In a semiconductor device like the electroluminescent display device described in this embodiment mode, a region except for a display region can be minimized by applying the present invention to a peripheral driver circuit region for example. That is, a region corresponding to a frame can be minimized and the display region can be used as efficiently as possible.

Note that there is no need to manufacture a transistor in a pixel region by using a single crystal semiconductor layer. However, even in the case of using a single crystal semiconductor layer, the channel length direction is not necessarily disposed in the <110> axis direction. Since the present invention is particularly effective in the case of forming both an n-channel transistor and a p-channel transistor, the structure of the present invention need not be applied for the case of forming only n-channel transistors. Needless to say, in the case where the effect of the present invention can be obtained such as the case of forming both an n-channel transistor and a p-channel transistor, it is preferable to apply transistors, in which the channel length direction is disposed in the <110> axis direction, to a pixel region. In this case, the layout can be optimized, and accordingly, the aperture ratio can be improved. Further, since more transistors can be formed in one pixel, more complicated driving is possible. Note that in the case where a single crystal semiconductor layer is not used for a pixel region, an amorphous semiconductor layer, a microcrystalline semiconductor layer, a polycrystalline semiconductor layer, or the like can be formed as appropriate. However, since variation of transistors often becomes a big problem in the pixel region of the electroluminescent display device, a single crystal semiconductor layer or a microcrystalline semiconductor layer, which causes fewer problems, is preferably used.

In the present invention, mobility of a p-channel transistor is maximized, and mobility of an n-channel transistor is suppressed to a certain value or less. Therefore, the mobility $\mu_n$ of the n-channel transistor and the mobility $\mu_p$ of the p-channel transistor generally satisfy the relation: $\mu_p \leq \mu_n \leq 2\mu_p$. In consideration of the possibility that the p-channel transistor and the n-channel transistor have different S values, in the case of manufacturing transistors both having the same or close level of current driving capability, the relation: $W_n/L_n:W_p/L_p=1:x$ (typically, $0.8 \leq x \leq 2$, preferably $1 \leq x \leq 1.5$, more preferably $1 \leq x \leq 1.2$) can be satisfied, where $L_n$ is the channel length of the n-channel transistor, $W_n$ is the channel width of the n-channel transistor, $L_p$ is the channel length of the p-channel transistor, and $W_p$ is the channel width of the p-channel transistor. Here, "the channel length" is a length (width) of a channel formation region in a direction parallel to the direction in which carriers flow. In addition, "the channel width" is a length (width) of a channel formation region in a direction perpendicular to the direction in which carriers flow.

In the case of using the (110) plane, there is a possibility of causing a problem of defects at the interface with an insulating layer, as compared to the case of using the (100) plane. If this problem really occurs, plasma treatment may be performed, for example, on the surface of the single crystal semiconductor layer, thereby the problem can be solved. Accordingly, a semiconductor device with high reliability can be provided.

By using the present invention in this manner, the semiconductor device can have improved reliability, and the semiconductor device (or part of it) can be miniaturized.

This embodiment mode is described using an electroluminescent display device; however, the present invention is not limited to this. This embodiment mode can be implemented in combination with any of Embodiment Modes 1 to 4, as appropriate.

Embodiment Mode 6

In Embodiment Mode 6, another example of a semiconductor device of the present invention will be described with reference to FIG. 15 and FIG. 16. In this embodiment mode, a microprocessor and an electronic tag are taken as examples; however, the semiconductor device of the present invention is not limited to these.

Figure 15:
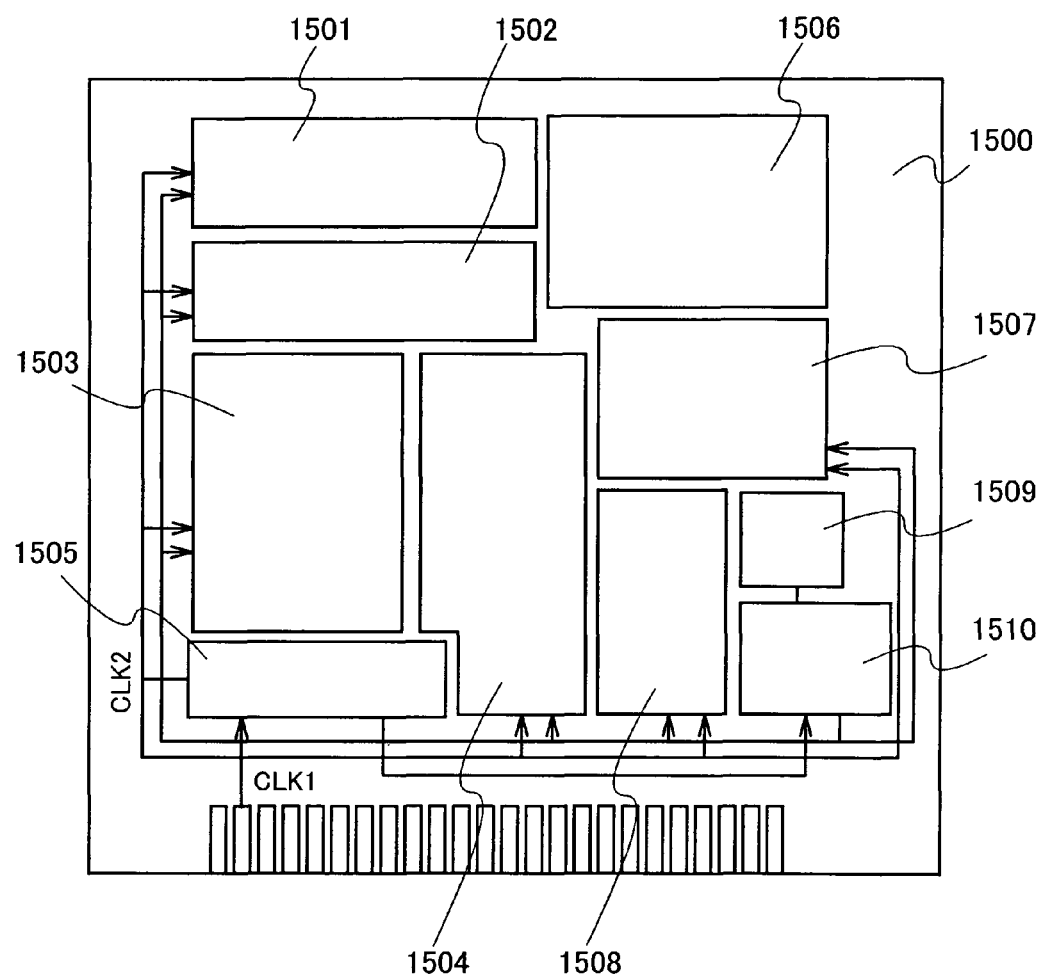
FIG. 15 illustrates a structure of a semiconductor device of the present invention.
Figure 16:
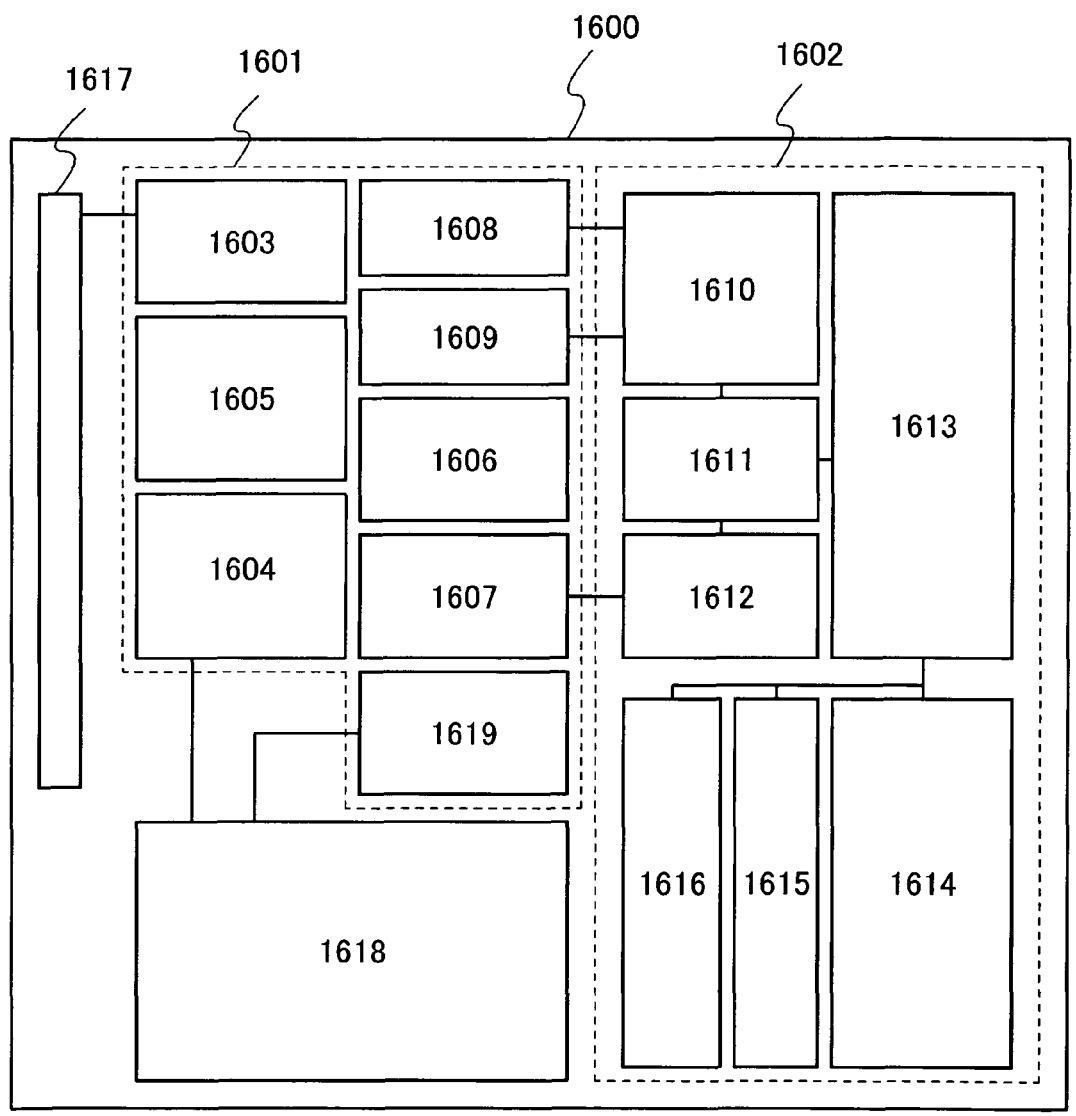
FIG. 16 illustrates a structure of a semiconductor device of the present invention.

FIG. 15 illustrates an example of a microprocessor of the present invention. A microprocessor 1500 in FIG. 15 is manufactured using a semiconductor substrate of the present invention. The microprocessor 1500 includes an arithmetic logic unit (ALU) 1501, an ALU controller 1502, an instruction decoder 1503, an interrupt controller 1504, a timing controller 1505, a register 1506, a register controller 1507, a bus interface (Bus I/F) 1508, a read only memory (ROM) 1509, and a ROM interface (ROM I/F) 1510.

An instruction input to the microprocessor 1500 through the bus interface 1508 is input to the instruction decoder 1503, decoded therein, and then input to the ALU controller 1502, the interrupt controller 1504, the register controller 1507, and the timing controller 1505. The ALU controller 1502, the interrupt controller 1504, the register controller 1507, and the timing controller 1505 conduct various controls based on the decoded instruction. Specifically, the ALU controller 1502 generates a signal for controlling the operation of the arithmetic logic unit 1501. The interrupt controller 1504 determines an interrupt request from an external input/output device or a peripheral circuit based on its priority or the like, and processes the request while a program of the microprocessor 1500 is executed. The register controller 1507 generates an address of the register 1506, and reads/writes data from/to the register 1506 in accordance with the state of the microprocessor 1500. The timing controller 1505 generates signals for controlling timing of operation of the arithmetic logic unit 1501, the ALU controller 1502, the instruction decoder 1503, the interrupt controller 1504, and the register controller 1507. For example, the timing controller 1505 is provided with an internal clock generator for generating an internal clock signal CLK2 based on a reference clock signal CLK1, and supplies the internal clock signal CLK2 to the above-described circuits. It is to be noted that the structure of the microprocessor 1500 illustrated in FIG. 15 is just an example, and the structure can be changed as appropriate depending on usage.

In the microprocessor of this embodiment mode, separation of a single crystal semiconductor layer from an insulating layer is suppressed by using a single crystal semiconductor layer having a (110) plane as a main surface. In addition, by using the (110) plane, flatness of a surface of the single crystal semiconductor layer is improved. Thus, reliability of a microprocessor can be improved by using the present invention.

Further, when transistors are manufactured using the single crystal semiconductor layer having a (110) plane as a main surface so that the channel length direction is disposed in a <110> axis direction like the microprocessor of this embodiment mode, mobility of a p-channel transistor can be maximized. Accordingly, the layout can be optimized and the microprocessor can be miniaturized.

In the case of using the (110) plane, there is a possibility of causing a problem of defects at the interface with an insulating layer, as compared to the case of using the (100) plane. If this problem really occurs, plasma treatment may be performed, for example, on the surface of the single crystal semiconductor layer, thereby the problem can be solved. Accordingly, a microprocessor with high reliability can be provided.

By using the present invention in this manner, the microprocessor which has improved reliability and is miniaturized can be provided.

Next, an example of a semiconductor device having an arithmetic function that can transmit and receive data without contact is described with reference to FIG. 16. FIG. 16 illustrates an example of a wireless tag which transmits and receives signals to/from an external device by wireless communication. Note that the wireless tag of the present invention includes a central processing unit (CPU), and is a so-called miniaturized computer. A wireless tag 1600 has an analog circuit portion 1601 and a digital circuit portion 1602. The analog circuit portion 1601 includes a resonance circuit 1603 having a resonant capacitor, a rectifier circuit 1604, a constant voltage circuit 1605, a reset circuit 1606, an oscillation circuit 1607, a demodulation circuit 1608, and a modulation circuit 1609. The digital circuit portion 1602 includes an RF interface 1610, a control register 1611, a clock controller 1612, a CPU interface 1613, a CPU 1614, a RAM 1615, and a ROM 1616.

The operation of the wireless tag 1600 having such a structure is described below. When an antenna 1617 receives a signal from the outside, the resonance circuit 1603 generates induced electromotive force based on the signal. The induced electromotive force passes through the rectifier circuit 1604 and is stored in a capacitor portion 1618. This capacitor portion 1618 is preferably formed using a capacitor such as a ceramic capacitor or an electric double layer capacitor. The capacitor portion 1618 may be formed over the same substrate as the wireless tag 1600 or may be attached, as another component, to a substrate having an insulating surface that partially constitutes the wireless tag 1600.

The reset circuit 1606 generates a signal for resetting and initializing the digital circuit portion 1602. For example, the reset circuit 1606 generates, as a reset signal, a signal that rises with delay after increase in the power supply voltage. The oscillation circuit 1607 changes the frequency and the duty ratio of a clock signal in accordance with a control signal generated by the constant voltage circuit 1605. The demodulation circuit 1608 having a low pass filter, for example, binarizes changes in amplitude of reception signals of an amplitude shift keying (ASK) system. The modulation circuit 1609 varies the amplitude of an amplitude-modulated (ASK) transmission signal and transmits the signal. The modulation circuit 1609 changes the amplitude of communication signals by changing the resonance point of the resonant circuit 1603. The clock controller 1612 generates a control signal for changing the frequency and the duty ratio of the clock signal in accordance with the power supply voltage or current consumption in the CPU 1614. The power supply voltage is monitored by a power supply control circuit 1619.

A signal that is input to the wireless tag 1600 from the antenna 1617 is demodulated by the demodulation circuit 1608, and then divided into a control command, data, and the like by the RF interface 1610. The control command is stored in the control register 1611. The control command includes a reading instruction of data stored in the ROM 1616, a writing instruction of data to the RAM 1615, an arithmetic instruction to the CPU 1614, and the like. The CPU 1614 accesses the ROM 1616, the RAM 1615, and the control register 1611 via the CPU interface 1613. The CPU interface 1613 has a function of generating an access signal for any of the ROM 1616, the RAM 1615, and the control register 1611 based on the address which the CPU 1614 requests.

As an arithmetic method of the CPU 1614, a method may be employed in which the ROM 1616 stores an operating system (OS) and a program is read and executed at the time of starting operation. Alternatively, a method may be employed in which an arithmetic circuit is formed and an arithmetic process is conducted using hardware. In a method in which both hardware and software are used, a method can be used in which part of process is conducted in a dedicated arithmetic circuit and the other part of the arithmetic process is conducted by the CPU 1614 using a program.

In the wireless tag of this embodiment mode, separation of a single crystal semiconductor layer from an insulating layer is suppressed by using a single crystal semiconductor layer having a (110) plane as a main surface. In addition, by using the (110) plane, flatness of a surface of the single crystal semiconductor layer is improved. Thus, reliability of a wireless tag can be improved by using the present invention.

Further, when transistors are manufactured using the single crystal semiconductor layer having a (110) plane as a main surface so that the channel length direction is disposed in a <110> axis direction like the wireless tag of this embodiment mode, mobility of a p-channel transistor can be maximized. Accordingly, the layout can be optimized and the wireless tag can be miniaturized.

In the case of using the (110) plane, there is a possibility of causing a problem of defects at the interface with an insulating layer, as compared to the case of using the (100) plane. If this problem really occurs, plasma treatment may be performed, for example, on the surface of the single crystal semiconductor layer, thereby the problem can be solved. Accordingly, a wireless tag with high reliability can be provided.

By using the present invention in this manner, the wireless tag which has improved reliability and is miniaturized can be provided.

This embodiment mode can be implemented in combination with any of Embodiment Modes 1 to 5, as appropriate.

Embodiment Mode 7

In Embodiment Mode 7, an electronic device using a semiconductor device of the present invention, in particular, using a display device will be described with reference to FIGS. 17A to 17H.

Examples of the electronic device manufactured using the semiconductor device of the present invention include a camera such as a video camera or a digital camera, a goggle type display (a head mounted display), a navigation system, an audio reproducing device (a car audio component, or the like), a computer, a game machine, a portable information terminal (a mobile computer, a cellular phone, a portable game machine, an electronic book, or the like), and an image reproducing device provided with a recording medium (specifically, a device provided with a display that can reproduce a content of a recording medium such as a digital versatile disc (DVD) and display the image), and the like.

Figure 17A:
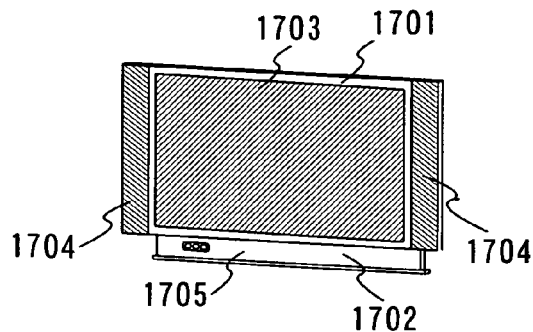
FIGS. 17A to 17H illustrate electronic devices each using a semiconductor device of the present invention.

FIG. 17A illustrates a television set or a monitor of a personal computer. The television set or monitor of a personal computer includes a chassis 1701, a support stand 1702, a display portion 1703, speakers 1704, video input terminals 1705, and the like. The semiconductor device of the present invention is used for the display portion 1703. According to the present invention, a high-performance and highly-reliable television set or monitor of a personal computer can be provided.

Figure 17B:
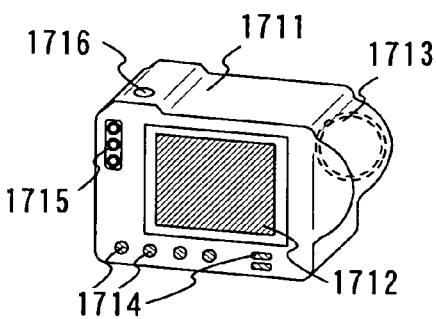

FIG. 17B illustrates a digital camera. An image receiving portion 1713 is provided in the front side of a main body 1711. A shutter button 1716 is provided at the upper portion of the main body 1711. A display portion 1712, operation keys 1714, and an external connection port 1715 are provided at the backside of the main body 1711. The semiconductor device of the present invention is used for the display portion 1712. According to the present invention, a high-performance and highly-reliable digital camera can be provided.

Figure 17C:
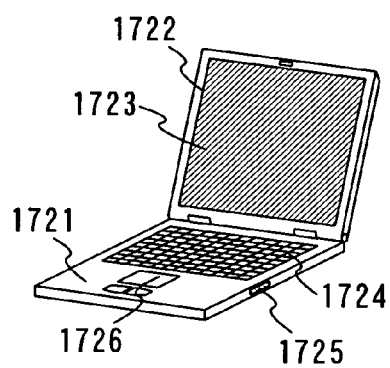

FIG. 17C illustrates a notebook personal computer. A main body 1721 is provided with a keyboard 1724, an external connection port 1725, and a pointing device 1726. In addition, a housing 1722 having a display portion 1723 is attached to the main body 1721. The semiconductor device of the present invention is used for the display portion 1723. According to the present invention, a high-performance and highly-reliable notebook personal computer can be provided.

Figure 17D:
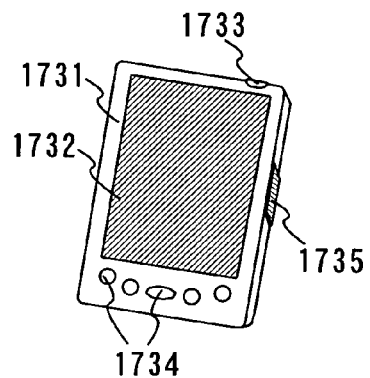

FIG. 17D illustrates a mobile computer, which includes a main body 1731, a display portion 1732, a switch 1733, an operation key 1734, an infrared port 1735, and the like. An active matrix display device is provided for the display portion 1732. The semiconductor device of the present invention is used for the display portion 1732. According to the present invention, a high-performance and highly-reliable mobile computer can be provided.

Figure 17E:
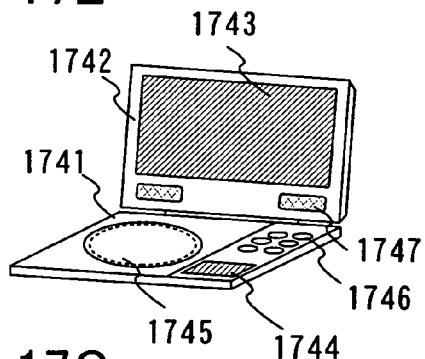

FIG. 17E illustrates an image reproducing device. A main body 1741 is provided with a display portion B 1744, a recording medium reading portion 1745, and an operation key 1746. In addition, a housing 1742 having a speaker portion 1747 and a display portion A 1743 is attached to the main body 1741. The semiconductor device of the present invention is used in each of the display portion A 1743 and the display portion B 1744. According to the present invention, a high-performance and highly reliable image reproducing device can be provided.

Figure 17F:
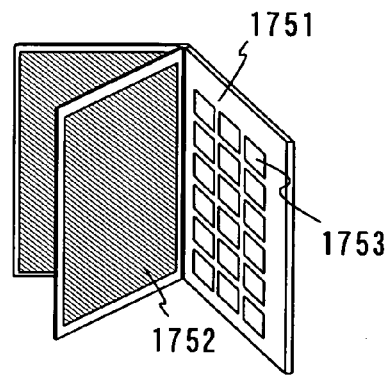

FIG. 17F illustrates an electronic book. A main body 1751 is provided with an operation key 1753. A plurality of display portions 1752 are attached to the main body 1751. The semiconductor device of the present invention is used for the display portion 1752. According to the present invention, a high-performance and highly-reliable electronic book can be provided.

Figure 17G:
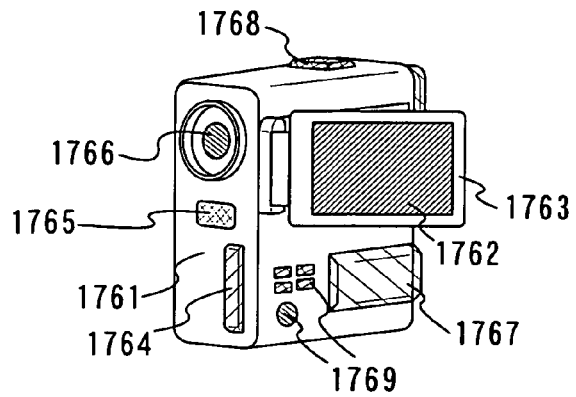

FIG. 17G illustrates a video camera. A main body 1761 is provided with an external connection port 1764, a remote control receiving portion 1765, an image receiving portion 1766, a battery 1767, an audio input portion 1768, and an operation key 1769. A housing 1763 having a display portion 1762 is attached to the main body 1761. The semiconductor device of the present invention is used for the display portion 1762. According to the present invention, a high-performance and highly-reliable video camera can be provided.

Figure 17H:
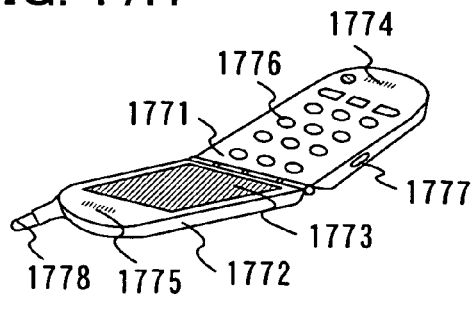
Figure 18A:
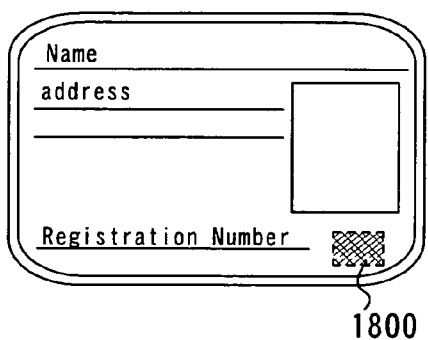
FIGS. 18A to 18F illustrate articles to which the semiconductor device of the present invention is applied.
Figure 18B:
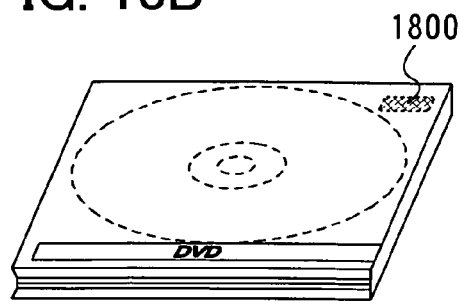
Figure 18C:
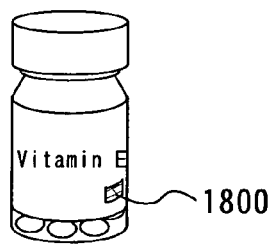
Figure 18D:
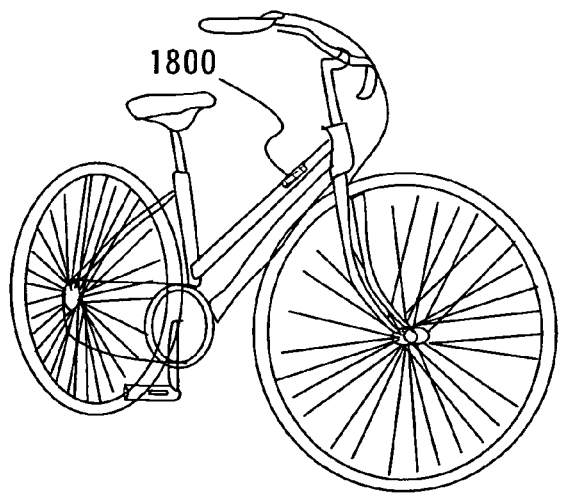
Figure 18E:
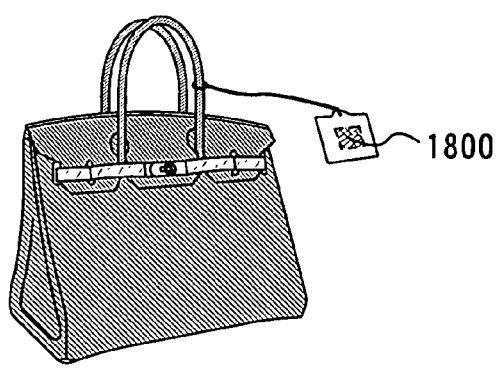
Figure 18F:
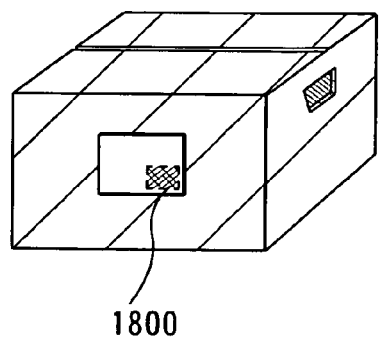

FIG. 17H illustrates a cellular phone, which includes a main body 1771, a housing 1772, a display portion 1773, an audio input portion 1774, an audio output portion 1775, an operation key 1776, an external connection port 1777, an antenna 1778, and the like. The semiconductor device of the present invention is used for the display portion 1773. According to the present invention, a high-performance and highly-reliable cellular phone can be provided.

As described above, the application range of the invention is so wide that the invention can be applied to electronic devices of various fields. This embodiment mode can be implemented in combination with any of Embodiment Modes 1 to 6, as appropriate.

Embodiment Mode 8

In Embodiment Mode 8, applications of a semiconductor device of the present invention, in particular, a wireless tag will be described with reference to FIGS. 18A to 18F.

A semiconductor device functioning as a wireless tag can be formed using the present invention. A wireless tag can be used in a wide variety of applications, and may be used by being mounted on objects such as bills, coins, securities, bearer bonds, certificates (driver's licenses, resident cards, and the like, see FIG. 18A), containers for wrapping objects (wrapping paper, bottles, and the like, see FIG. 18C), recording media (DVD software, video tapes, and the like, see FIG. 18B), vehicles (bicycles and the like, see FIG. 18D), personal belongings (bags, glasses, and the like), foods, plants, clothes, lifestyle goods, products such as electronic devices, or shipping tags of baggage (see FIGS. 18E and 18F). Note that the wireless tag is indicated by reference numeral 1800 in each of FIGS. 18A to 18F.

Note that the electronic device indicates a liquid crystal display device, an EL display device, a television device (also simply referred to as a TV, a TV receiver, or a television receiver), a cellular phone, and the objects described in Embodiment Mode 7, for example. In addition, the above-described semiconductor device can be used for animals, human bodies, or the like.

The wireless tag is attached to a surface of an object or embedded in an object to be fixed. For example, the wireless tag may be embedded in paper of a book, or an organic resin of a container for wrapping an object. Counterfeits can be prevented by providing an RFID tag on the paper money, coin, securities, bearer bonds, certificates, and the like. Further, by providing an RFID tag in containers for wrapping objects, recording media, personal belongings, foods, clothes, lifestyle goods, electronic devices, and the like, inspection systems, rental systems, and the like can be performed more efficiently. The wireless tag that can be formed using the present invention has high performance and high reliability, and can be applied to various objects.

When a wireless tag that can be formed using the present invention is applied to a management system or a distribution system of articles, the system can have high functionality. For example, information which is recorded in an RFID tag provided in a baggage tag is read by a reader/writer provided near a conveyor belt, then information about a distribution process or a delivery destination is read out, and inspection of merchandise or distribution of goods can be easily carried out.

As described above, the application range of the present invention is extremely wide and can be used in various objects. This embodiment mode can be implemented in combination with any of Embodiment Modes 1 to 7, as appropriate.

This application is based on Japanese Patent Application serial no. 2007-227042 filed with Japan Patent Office on Aug. 31, 2007, the entire contents of which are hereby incorporated by reference.

What is claimed is:

1. A manufacturing method of a semiconductor device, comprising the steps of:
    forming an embrittlement layer in a single crystal semiconductor substrate having a (110) plane as a main surface by irradiation of the main surface with ions;
    forming an insulating layer over the main surface of the single crystal semiconductor substrate;
    bonding the insulating layer and a substrate having an insulating surface;
    separating the single crystal semiconductor substrate along the embrittlement layer to provide a single crystal semiconductor layer having the (110) plane as a main surface over the substrate having the insulating surface; and
    forming an n-channel transistor and a p-channel transistor to each have a <110> axis of the single crystal semiconductor layer in a channel length direction.

2. The manufacturing method of a semiconductor device according to claim 1, wherein the insulating layer includes a silicon oxide film formed by a chemical vapor deposition method using an organosilane gas.

3. The manufacturing method of a semiconductor device according to claim 1, wherein plasma treatment is performed on the main surface of the single crystal semiconductor substrate.

4. The manufacturing method of a semiconductor device according to claim 1, wherein the ions include any of $H^+$, $H_2^+$, and $H_3^+$.

5. The manufacturing method of a semiconductor device according to claim 1, wherein the n-channel transistor and the p-channel transistor are formed so as to satisfy a relation:

$$W_n/L_n:W_p/L_p=1:x(0.8\leq x\leq 2),$$

where $L_n$ is a channel length of the n-channel transistor, $W_n$ is a channel width of the n-channel transistor, $L_p$ is a channel length of the p-channel transistor, and $W_p$ is a channel width of the p-channel transistor.

6. A manufacturing method of a semiconductor device, comprising the steps of:
    forming an embrittlement layer in a single crystal semiconductor substrate having a (110) plane as a main surface by irradiation of the main surface with ions;
    forming an insulating layer over a substrate having an insulating surface;
    bonding the insulating layer and the single crystal semiconductor substrate;
    separating the single crystal semiconductor substrate along the embrittlement layer to provide a single crystal semiconductor layer having the (110) plane as a main surface over the substrate having the insulating surface; and
    forming an n-channel transistor and a p-channel transistor to each have a <110> axis of the single crystal semiconductor layer in a channel length direction.

7. The manufacturing method of a semiconductor device according to claim 6, wherein the insulating layer includes a silicon oxide film formed by a chemical vapor deposition method using an organosilane gas.

8. The manufacturing method of a semiconductor device according to claim 6, wherein plasma treatment is performed on the main surface of the single crystal semiconductor substrate.

9. The manufacturing method of a semiconductor device according to claim 6, wherein the ions include any of $H^+$, $H_2^+$, and $H_3^+$.

10. The manufacturing method of a semiconductor device according to claim 6, wherein the n-channel transistor and the p-channel transistor are formed so as to satisfy a relation:

$$W_n/L_n:W_p/L_p=1:x(0.8\leq x\leq 2),$$

where $L_n$ is a channel length of the n-channel transistor, $W_n$ is a channel width of the n-channel transistor, $L_p$ is a channel length of the p-channel transistor, and $W_p$ is a channel width of the p-channel transistor.

11. A manufacturing method of a semiconductor device, comprising the steps of:
    forming an embrittlement layer in a single crystal semiconductor substrate having a (110) plane as a main surface by irradiation of the main surface with ions;
    forming a first insulating layer over a substrate having an insulating surface;
    forming a second insulating layer over the main surface of the single crystal semiconductor substrate;
    bonding the first insulating layer and the second insulating layer;

separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

12. The manufacturing method of a semiconductor device according to claim 11, wherein the first insulating layer or the second insulating layer includes a silicon oxide film formed by a chemical vapor deposition method using an organosilane gas.

13. The manufacturing method of a semiconductor device according to claim 11, wherein the first insulating layer includes a silicon oxide film, and wherein the second insulating layer includes any of a silicon oxide film, a silicon oxynitride film, and a silicon nitride oxide film.

14. The manufacturing method of a semiconductor device according to claim 11, wherein the first insulating layer has a stacked structure of a silicon nitride film and a silicon oxide film, and wherein the second insulating layer includes a silicon oxide film.

15. The manufacturing method of a semiconductor device according to claim 11, wherein plasma treatment is performed on the main surface of the single crystal semiconductor substrate.

16. The manufacturing method of a semiconductor device according to claim 11, wherein the ions include any of $H^+$, $H_2^+$, and $H_3^+$.

17. The manufacturing method of a semiconductor device according to claim 11, wherein the n-channel transistor and the p-channel transistor are formed so as to satisfy a relation:

$$W_n/L_n:W_p/L_p=1:x(0.8\leq x\leq 2),$$

where $L_n$ is a channel length of the n-channel transistor, $W_n$ is a channel width of the n-channel transistor, $L_p$ is a channel length of the p-channel transistor, and $W_p$ is a channel width of the p-channel transistor.

18. A manufacturing method of a semiconductor device, comprising the steps of:

forming a first insulating layer over a main surface of a (110) plane of a single crystal semiconductor substrate;

forming an embrittlement layer in the single crystal semiconductor substrate by irradiation of the first insulating layer with ions;

forming a second insulating layer over a substrate having an insulating surface;

bonding the second insulating layer and the first insulating layer;

separating the single crystal semiconductor substrate along the embrittlement layer to provide a single crystal semiconductor layer having the (110) plane as a main surface over the substrate having the insulating surface; and forming an n-channel transistor and a p-channel transistor to each have a <110> axis of the single crystal semiconductor layer in a channel length direction.

19. The manufacturing method of a semiconductor device according to claim 18, wherein the second insulating layer includes a silicon oxide film formed by a chemical vapor deposition method using an organosilane gas.

20. The manufacturing method of a semiconductor device according to claim 18, wherein the first insulating layer includes any of a silicon oxide film, a silicon nitride film, a silicon oxynitride film, and a silicon nitride oxide film.

21. The manufacturing method of a semiconductor device according to claim 18, wherein the ions include any of $H^+$, $H_2^+$, and $H_3^+$.

22. The manufacturing method of a semiconductor device according to claim 18, wherein the n-channel transistor and the p-channel transistor are formed so as to satisfy a relation:

$$W_n/L_n:W_p/L_p=1:x(0.8\leq x\leq 2),$$

where $L_n$ is a channel length of the n-channel transistor, $W_n$ is a channel width of the n-channel transistor, $L_p$ is a channel length of the p-channel transistor, and $W_p$ is a channel width of the p-channel transistor.

* * * * *